US010714571B2

(12) United States Patent
Koyama et al.

(10) Patent No.: US 10,714,571 B2
(45) Date of Patent: Jul. 14, 2020

(54) SILICON CARBIDE SEMICONDUCTOR DEVICE HAVING HALOGEN FIELD LIMITING RING REGIONS AND METHOD OF MANUFACTURING SAME

(71) Applicant: Mitsubishi Electric Corporation, Chiyoda-ku (JP)

(72) Inventors: Akihiro Koyama, Tokyo (JP); Kohei Ebihara, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 16/303,797

(22) PCT Filed: May 19, 2017

(86) PCT No.: PCT/JP2017/018816
§ 371 (c)(1),
(2) Date: Nov. 21, 2018

(87) PCT Pub. No.: WO2018/016165
PCT Pub. Date: Jan. 25, 2018

(65) Prior Publication Data
US 2019/0237548 A1 Aug. 1, 2019

(30) Foreign Application Priority Data
Jul. 20, 2016 (JP) ................................. 2016-142454

(51) Int. Cl.
*H01L 29/16* (2006.01)
*H01L 29/06* (2006.01)
(Continued)

(52) U.S. Cl.
CPC .... *H01L 29/1608* (2013.01); *H01L 21/02529* (2013.01); *H01L 29/06* (2013.01);
(Continued)

(58) Field of Classification Search
CPC . H01L 29/1608; H01L 29/06; H01L 29/0619; H01L 29/12; H01L 29/47; H01L 29/78; H01L 29/872; H01L 29/407
See application file for complete search history.

(56) References Cited

U.S. PATENT DOCUMENTS 6,110,803 A * 8/2000 Tung ..................... H01L 21/266
438/442
6,153,913 A * 11/2000 Hsu .................... H01L 21/28518
257/173
(Continued)

FOREIGN PATENT DOCUMENTS

CN  103346169 A * 10/2013 ........... H01L 29/872
EP  1959501 A2 * 8/2008 ......... H01L 29/7722
(Continued)

OTHER PUBLICATIONS

International Search Report dated Jun. 27, 2017 in PCT/JP2017/018816 filed May 19, 2017.
(Continued)

*Primary Examiner* — Ida M Soward
(74) *Attorney, Agent, or Firm* — Xsensus LLP

(57) ABSTRACT

A semiconductor layer having n-type is made of silicon carbide, and has an element region and a terminal region. A plurality of field limiting ring regions having p-type are provided in the terminal region of the semiconductor layer, and are arranged spaced apart from one another. A field insulating film is provided in the terminal region of the semiconductor layer, and is in contact with the field limiting ring regions and the semiconductor layer. Each of the field limiting regions includes a halogen-containing field limiting ring part in contact with the field insulating film and containing halogen family atoms.

9 Claims, 40 Drawing Sheets

(51) Int. Cl.

| | |
|---|---|
| *H01L 29/12* | (2006.01) |
| *H01L 29/47* | (2006.01) |
| *H01L 29/78* | (2006.01) |
| *H01L 29/87* | (2006.01) |
| *H01L 29/40* | (2006.01) |
| *H01L 29/872* | (2006.01) |
| *H01L 21/02* | (2006.01) |

(52) U.S. Cl.
CPC .......... *H01L 29/0619* (2013.01); *H01L 29/12* (2013.01); *H01L 29/47* (2013.01); *H01L 29/78* (2013.01); *H01L 29/872* (2013.01); *H01L 29/407* (2013.01)

(56) References Cited

U.S. PATENT DOCUMENTS

| | | | | |
|---|---|---|---|---|
| 6,246,101 | B1* | 6/2001 | Akiyama | H01L 21/76202 257/508 |
| 9,006,748 | B2* | 4/2015 | Tanaka | H01L 29/6606 257/200 |
| 9,224,802 | B2* | 12/2015 | Hiyoshi | H01L 29/66068 |
| 9,773,924 | B2* | 9/2017 | Uchida | H01L 29/0692 |
| 9,786,736 | B2* | 10/2017 | Tamaki | H01L 29/66681 |
| 9,972,713 | B2* | 5/2018 | Eguchi | H01L 29/66477 |
| 2006/0118792 | A1 | 6/2006 | Ryu et al. | |
| 2015/0048384 | A1* | 2/2015 | Tanaka | H01L 29/47 257/77 |
| 2015/0357405 | A1 | 12/2015 | Ueda et al. | |
| 2016/0181442 | A1* | 6/2016 | Higashida | H01L 29/872 257/483 |
| 2016/0293690 | A1* | 10/2016 | Masuda | H01L 29/78 |

FOREIGN PATENT DOCUMENTS

| | | | |
|---|---|---|---|
| JP | 2003-282888 | A | 10/2003 |
| JP | 2007173705 | A * | 7/2007 |
| JP | 2008-251772 | A | 10/2008 |
| JP | 2013-62518 | A | 4/2013 |
| JP | 2016-15482 | A | 1/2016 |

OTHER PUBLICATIONS

Noborio, M. et al., "P-Channel MOSFETs on 4H—SiC {0001} and Nonbasal Faces Fabricated by Oxide Deposition and $N_2O$ Annealing," IEEE Transactions on Electron Devices, vol. 56, No. 9, Sep. 2009, pp. 1953-1958.

Kimoto, T. et al. "Interface Properties of Metal-Oxide-Semiconductor Structures on 4H—SiC{0001} and (1120) Formed by $N_2O$ Oxidation," Japanese Journal of Applied Physics, vol. 44, No. 3, Mar. 8, 2005, pp. 1213-1218.

\* cited by examiner

F I G. 1 7
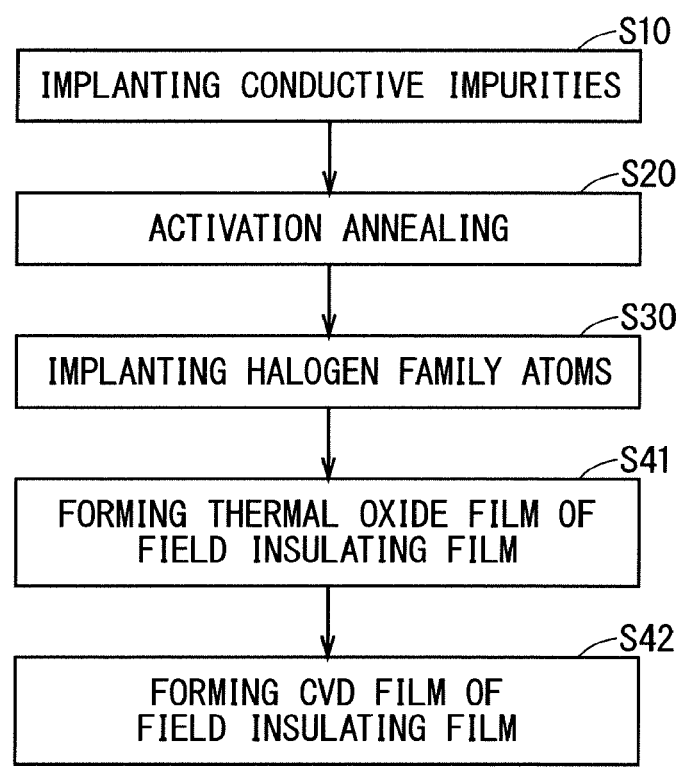

SILICON CARBIDE SEMICONDUCTOR DEVICE HAVING HALOGEN FIELD LIMITING RING REGIONS AND METHOD OF MANUFACTURING SAME

TECHNICAL FIELD

The present invention relates to a silicon carbide semiconductor device and a method of manufacturing the same.

BACKGROUND ART

For power electronics equipment such as inverters, further energy saving is constantly demanded. For this reason, it is required to reduce the loss of the power semiconductor element used therefor. An insulated gate bipolar transistor (IGBT), a metal oxide semiconductor field effect transistor (MOSFET), a positive intrinsic negative (PiN) diode, a Schottky barrier diode (SBD), and so forth, are particularly required such reduction in loss. As an effective method for reducing the loss, instead of silicon (Si), which is the most common semiconductor material, a method of using silicon carbide (SiC) has been studied; for example, practical application thereof has started in the railway field and so forth. Utilization of the fact that SiC has a higher dielectric breakdown electric field than Si reduces the thickness of the device further, thereby reducing the loss. Furthermore, using SiC ensures the high temperature operation, therefore, it is also useful for downsizing of equipment for cooling a semiconductor element. Therefore, SiC devices are considered to become more popular in the market as their cost reduction progresses.

SiC devices are expected to be used in the breakdown voltage region of several 100 V to several 10 kV. Such a device is typically provided with a terminal structure referred to as a field limiting ring (FLR) or a guard ring to ensure sufficient breakdown voltage.

It is known that some fixed charge may exist at the interface between SiC and an insulator such as silicon dioxide ($SiO_2$). According to Non-Patent Document 1, it is stated that a positive charge of $+2.4\times10^{12}$ cm$^{-2}$ exists at the interface between the p-type SiC having the plane orientation (0001) and the $SiO_2$ film formed by the dry oxidation. According to Non-Patent Document 2, it is stated that when an oxide film is formed by dry oxidation, a negative charge of $-1.4\times10^{12}$ cm$^{-2}$ exists at the interface between n-type SiC having plane orientation (0001) and $SiO_2$.

Fixed charge may affect device characteristics. In Patent Document 1, the influence of the positive surface charge between the oxide and the semiconductor is reduced by providing a low-concentration p-type surface-charge compensation region between the p-type guard ring layers. In Patent Document 2, utilizing the factor that a positive fixed charge layer is formed by dry oxidation and the factor that a negative fixed charge layer is formed by wet oxidation and wet reoxidation, with the depletion layer between the SiC and the interface fixed charge layer, thereby obtaining the electric field relaxation effect.

PRIOR ART DOCUMENTS

Patent Documents

[Patent Document 1] Japanese Patent Application Laid-Open No. 2013-62518

[Patent Document 2] Japanese Patent Application Laid-Open No. 2003-282888

Non-Patent Documents

[Non-Patent Document 1] M. Noborio et al., IEEE Trans. Electron Devices, vol. 56, no. 9, pp. 1953-1958, September 2009.

[Non-Patent Document 2] T. Kimoto et al., Jpn. J. Appl. Phys., vol. 44, no. 3, pp. 1213-1218, 2005

SUMMARY

Problem to be Solved by the Invention

The fixed charge may also affect the breakdown voltage characteristic, which is one of the important characteristics for the power semiconductor device. In this regard, we have studied n-type devices with p-type field limiting rings as terminal structures. Each of FIGS. 1 and 2 is a graphical representation illustrating a comparison between measurement results and simulation results in a relationship between dosages and breakdown voltages for forming a field limiting ring. In the simulation, it is assumed that there is no fixed charge at the interface between the field limiting ring and the field insulating film. FIG. 1 illustrates a case where the field insulating film on the field limiting ring is $SiO_2$, and FIG. 2 illustrates a case where the field insulating film on the field limiting ring is polyimide. In both cases the measurement result differs from the simulation result. Specifically, as compared with the simulation result, a shift in the dosage to the positive side (right side in the figure) (hereinafter referred to as "dosage shift") is observed in the measurement result. In FIG. 1, a dosage shift of about $2.5\times10^{12}$ cm$^{-2}$ is observed, and in FIG. 2 a dosage shift of about $6.5\times10^{12}$ cm$^{-2}$ is observed. The dosage shift causes variation in the amount of ion implantation capable of obtaining the designed breakdown voltage value.

Accordingly, when SiC is used as the semiconductor material, the terminal structure is influenced by the fixed charge. As a result, the actual breakdown voltage value differs from the design value when assumed that there is no fixed charge. In particular, when the terminal structure region is reduced so as to increase the number of chips per wafer for cost reduction, the margin of the breakdown voltage becomes narrow. For this reason, the influence of the fixed charge may be increased. In addition, the fixed charge may be introduced into the semiconductor device from the outside, which may cause the breakdown voltage value to fluctuate. The introduction of the fixed charge from the outside may occur either during the manufacture of the semiconductor device, during assembly of the module using the manufactured semiconductor device, or during use of the semiconductor device.

Also with the method of Patent Document 1, the surface charge between the oxide and the semiconductor is compensated to some extent. However, the surface charge compensation region is unable to have a high concentration due to the breakdown voltage design; the positive surface charge amount that can be compensated is limited. Further, the positive fixed charge at the guard ring layer/insulating film interface are unable to be compensated.

According to the method of Patent Document 2, when the fixed charge layer is formed of a thermal oxide film, the fixed charge amount is to be controlled with difficulty, and the fixed charge layer is uniformly formed on the SiC surface; therefore, individual control of the fixed charge amounts on the n-type layer and the p-type layer is unable to perform. Therefore, by excessively compensating the fixed charge, the optimum ion implantation amount for obtaining the designed breakdown voltage may excessively fluctuate. Also, in the fabrication of an n-type device, when the field oxide film is formed by wet oxidation, the reliability of the semiconductor device may be deteriorated by roughening the surface due to the generation of pits.

The present invention has been made in view of the aforementioned issues, and it is an object of the present invention to provide a silicon carbide semiconductor device and a method of manufacturing thereof that ensure the improvement of robustness of the breakdown voltage performance.

Means to Solve the Problem

According to the present invention, a silicon carbide semiconductor device includes a semiconductor substrate, a semiconductor layer, a plurality of field limiting ring regions, and a field insulating film. The semiconductor layer having n-type, is provided on the semiconductor substrate, is made of silicon carbide, and has an element region and a terminal region outside the element region. The plurality of field limiting ring regions having p-type are provided in the terminal region of the semiconductor layer, and are arranged spaced apart from one another. The field insulating film is provided on the terminal region of the semiconductor layer, and is in contact with the field limiting ring regions and the semiconductor layer. Each of the field limiting regions includes a halogen-containing field limiting ring part in contact with the field insulating film and containing halogen family atoms.

According to the present invention, a method of manufacturing a silicon carbide semiconductor device includes the following steps. On a semiconductor substrate, a semiconductor layer having n-type, made of silicon carbide, and having an element region and a terminal region outside the element region, is formed. In the terminal region of the semiconductor layer, a plurality of field limiting ring regions having p-type and arranged spaced apart from one another are formed by implanting acceptor ions. Activation annealing to electrically activate the acceptor ions is performed. A halogen-containing field limiting ring part is formed by implanting halogen family atoms into a part of each of the field limiting ring regions. A field insulating film is formed on the terminal region of the semiconductor layer.

Effects of the Invention

According to the present invention, each of the field limiting regions includes a halogen-containing field limiting ring part in contact with the field insulating film and containing halogen family atoms. Halogen family atoms have a large electronegativity; therefore, halogen family atoms are easily negatively charged. The negative charge compensates positive fixed charge existing at the interface between the p-type field limiting regions and the field insulating film. The influence of the positive fixed charge on the breakdown voltage is thus alleviated. Therefore, variation in breakdown voltage performance is suppressed. In other words, the robustness of the breakdown voltage performance is improved.

These and other objects, features, aspects and advantages of the present invention will become more apparent from the following detailed description of the present invention when taken in conjunction with the accompanying drawings.

BRIEF DESCRIPTION OF DRAWINGS

FIG. 17 A flow chart illustrating the method of manufacturing the SBD of FIG. 16.

DESCRIPTION OF EMBODIMENTS

Figure 1:
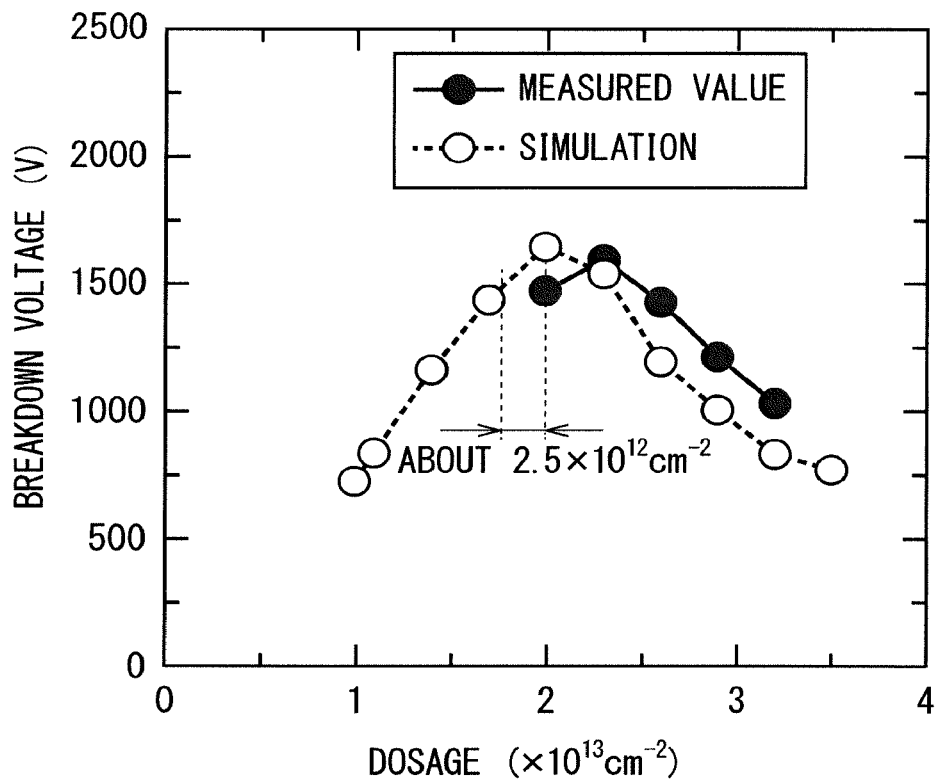
FIG. 1 A graphical representation illustrating a comparison between measurement results and simulation results in a relationship between dosages and breakdown voltages for forming a field limiting ring when a material of the field insulating film is silicon dioxide.

Hereinafter, Embodiments of the present invention is described with reference to the drawings. It should be noted that, in the following drawings, same or equivalent components are denoted by the same reference numerals and the descriptions thereof are not repeated.

Embodiment 1

Figure 3:
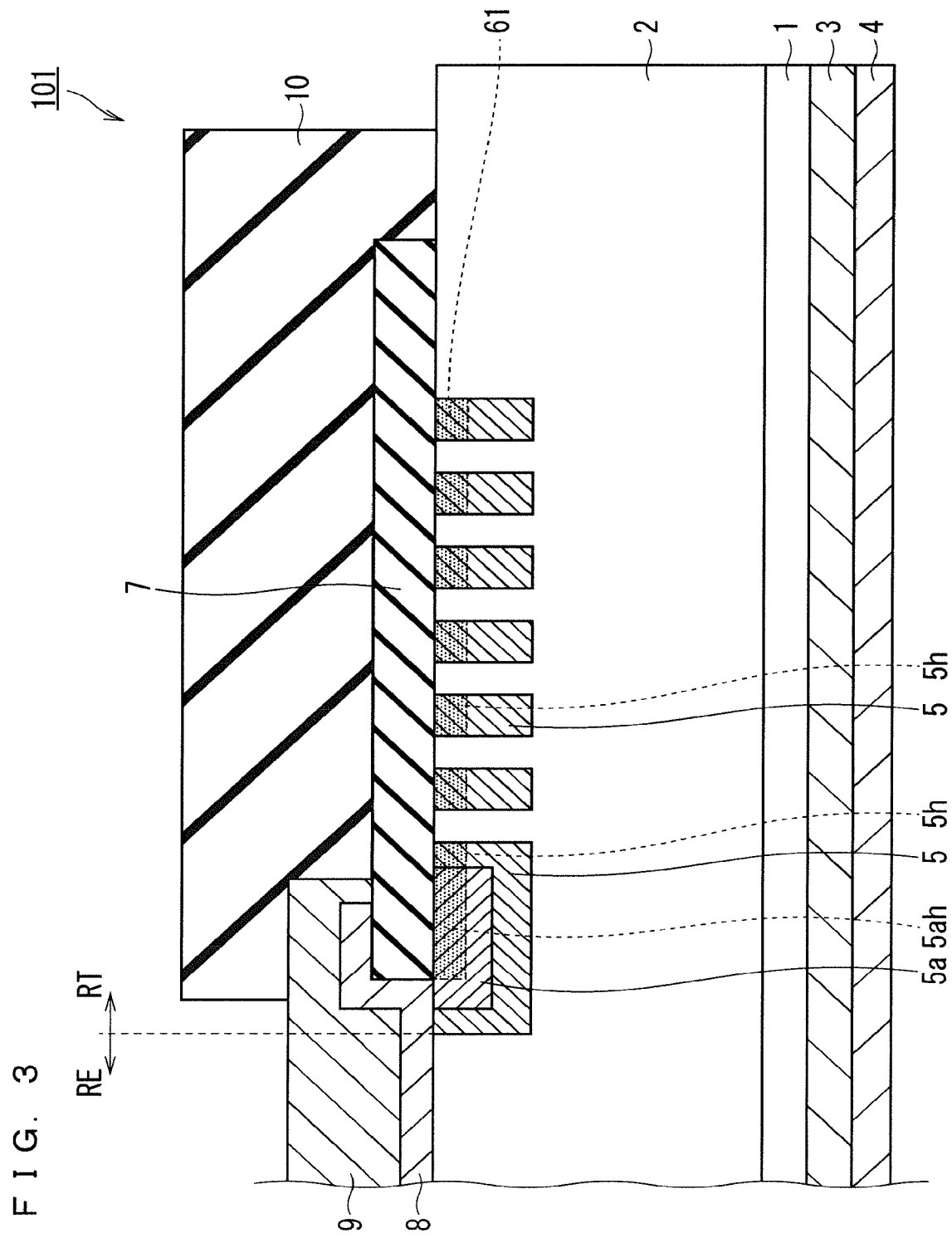
FIG. 3 A local sectional view schematically illustrating a configuration of an SBD as a silicon carbide semiconductor device according to Embodiment 1 of the present invention.

FIG. 3 is a local sectional view schematically illustrating a configuration of an SBD (silicon carbide semiconductor device) 101 according to Embodiment 1. The SBD 101 includes a drift layer (semiconductor layer) 2, a plurality of field limiting ring regions (FLR regions) 5, and a field insulating film 7.

A semiconductor substrate 1 is made of SiC. SiC having a polytype of 4H is preferable. The semiconductor substrate 1 has n-type. The impurity concentration of the semiconductor substrate 1 is, for example, $1 \times 10^{19}$ cm$^{-3}$ or so. The semiconductor substrate 1 has an upper surface (first surface) and a lower surface (second surface opposite to the first surface). The semiconductor substrate 1 has a thickness of 50 μm or more and 500 μm or less, for example. The upper surface of the semiconductor substrate 1 has an off-angle of some degrees with respect to a plane orientation (0001).

The drift layer 2 is provided on the upper surface of the semiconductor substrate 1. The drift layer 2 is made of SiC and has n-type. The drift layer 2 has an element region RE and a terminal region RT outside of the element region RE. The terminal region RT is arranged outside the element region RE, and typically encloses the element region RE. A structure for obtaining a function of the SBD 101 as an element per se, specifically, a function as a diode element is formed in the element region RE of the drift layer 2. The impurity concentration and the thickness of the drift layer 2 are defined by a specification of breakdown voltages. For example, the impurity concentration is $5 \times 10^{14}$ cm$^{-3}$ or more and $1 \times 10^{18}$ cm$^{-3}$ or less and the thickness is 4 μm or more and 100 μm or less.

The plurality of FLR regions 5 are provided in the terminal region RT in the drift layer 2. Each of the plurality of FLR regions 5 is arranged so as to be spaced apart from one another. Each of the FLR regions 5 is apart from the semiconductor substrate 1. Each of the FLR regions 5 has a ring-shape in a plane layout. Each of the FLR regions 5 is made of SiC. The FLR regions 5 have p-type by addition of an acceptor. As the acceptor, for example, aluminum or boron is used. The FLR regions 5 have a function as an electric field relaxation layer. The one of the FLR regions 5 which is at the innermost circumference encloses the element region RE in the plane layout. The one of the FLR regions 5 which is at the innermost circumference may have a high-concentration region 5a which is provided in a well shape. The high-concentration region 5a contains higher impurity concentration in comparison with the FLR regions 5 except the high-concentration region 5a.

The field insulating film 7 is provided on the terminal region RT and is in contact with the FLR regions 5 and the drift layer 2. The field insulating film 7 is made of, for example, silicon dioxide. An inner end portion of the field insulating film 7 (the left end portion in the figure) is arranged on the high-concentration region 5a and arranged apart from the both ends of the high-concentration region 5a. The field insulating film 7 has a thickness of 0.5 μm or more and 3 μm or less, for example.

Each of the FLR regions 5 includes a halogen-containing field limiting ring part 5h in contact with the field insulating film 7 and containing halogen family atoms. The depth of the halogen-containing field limiting ring part 5h is smaller than the depth of the FLR region 5 and is, for example, 0.2 μm or more and 1 μm or less, or so. The halogen-containing field limiting ring part 5h includes a halogen-containing high-concentration part 5ah which is a part of the high-concentration region 5a. The inner end portion (the left end portion in the figure) of the halogen-containing high-concentration part 5ah is arranged outside the inner end portion of the high-concentration region 5a. The position of an inner end portion of the halogen-containing field limiting ring part 5h constituted by the halogen-containing high-concentration part 5ha coincides with the position of the inner end portion of the field insulating film 7. The halogen-containing field limiting ring part 5h forms a negative fixed charge layer 61 by containing halogen family atoms. As the halogen family atoms, for example, a fluorine (F) atom or a chlorine (Cl) atom can be used.

The SBD 101 further includes the semiconductor substrate 1, a rear surface ohmic electrode 3, a cathode electrode 4, a Schottky electrode 8, an anode electrode 9, and a protective insulating film 10. The Schottky electrode 8 is brought into Schottky junction with the element region RE of the drift layer 2. An end portion of the Schottky electrode 8 extends to the inside of the terminal region RT and is arranged on the field insulating film 7. The anode electrode 9 is directly provided on the Schottky electrode 8. The anode electrode 9 has an area larger than the area of the Schottky electrode 8 and covers the Schottky electrode 8. The protective insulating film 10 covers an edge portion of the anode electrode 9, the field insulating film 7, and an edge portion of the drift layer 2. The rear surface ohmic electrode 3 is brought into ohmic junction with the lower surface of the semiconductor substrate 1. The cathode electrode 4 is in contact with the rear surface ohmic electrode 3.

Figure 2:
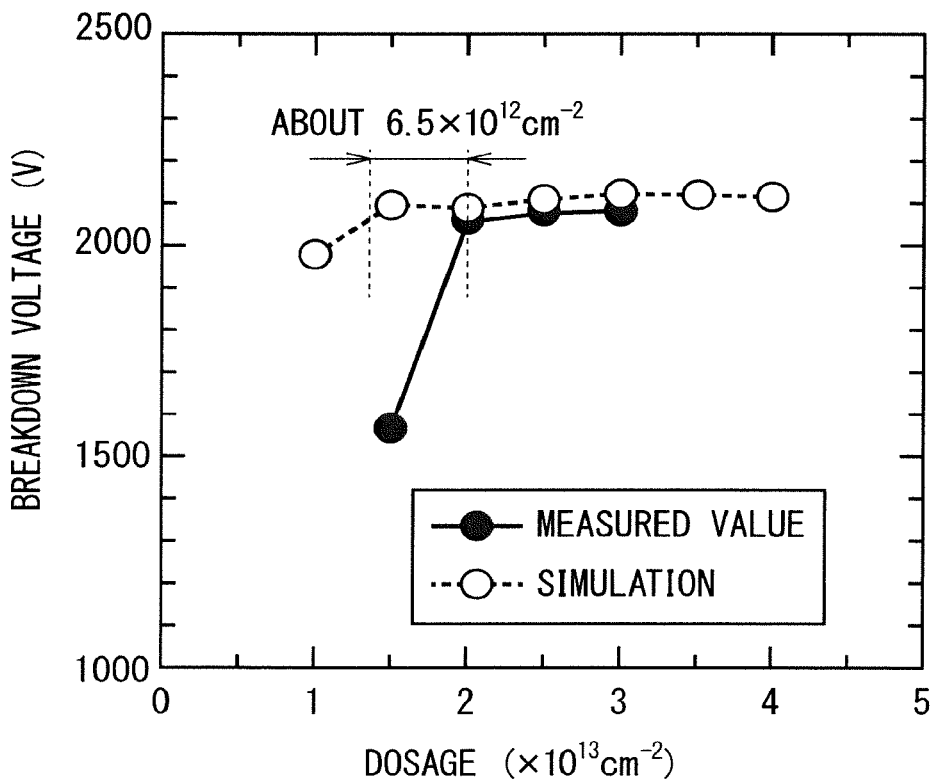
FIG. 2 A graphical representation illustrating a comparison between measurement results and simulation results in a relationship between dosages and breakdown voltages for forming a field limiting ring when a material of the field insulating film is polyimide.

According to the SBD 101 of Embodiment 1, each of the FLR regions 5 includes a halogen-containing field limiting ring part 5h in contact with the field insulating film 7 and containing halogen family atoms. Halogen family atoms have a large electronegativity; therefore, halogen family atoms are easily negatively charged. The fixed charge layer 61 formed by the negative charge compensates positive fixed charges existing at the interface between the p-type FLR regions 5 and the field insulating film 7. The influence of the positive fixed charge on the breakdown voltage is thus alleviated. Specifically, a dosage shift (see FIGS. 1 and 2) is suppressed, and a breakdown voltage close to a designed breakdown voltage when no fixed charge is assumed, is obtained thereby. Therefore, variation in the breakdown voltage performance attributed to the manufacturing process or manufacturing environment can be suppressed. In other words, the robustness of the breakdown voltage performance is improved.

Next, the method of manufacturing the SBD 101 is described below.

Figure 4:
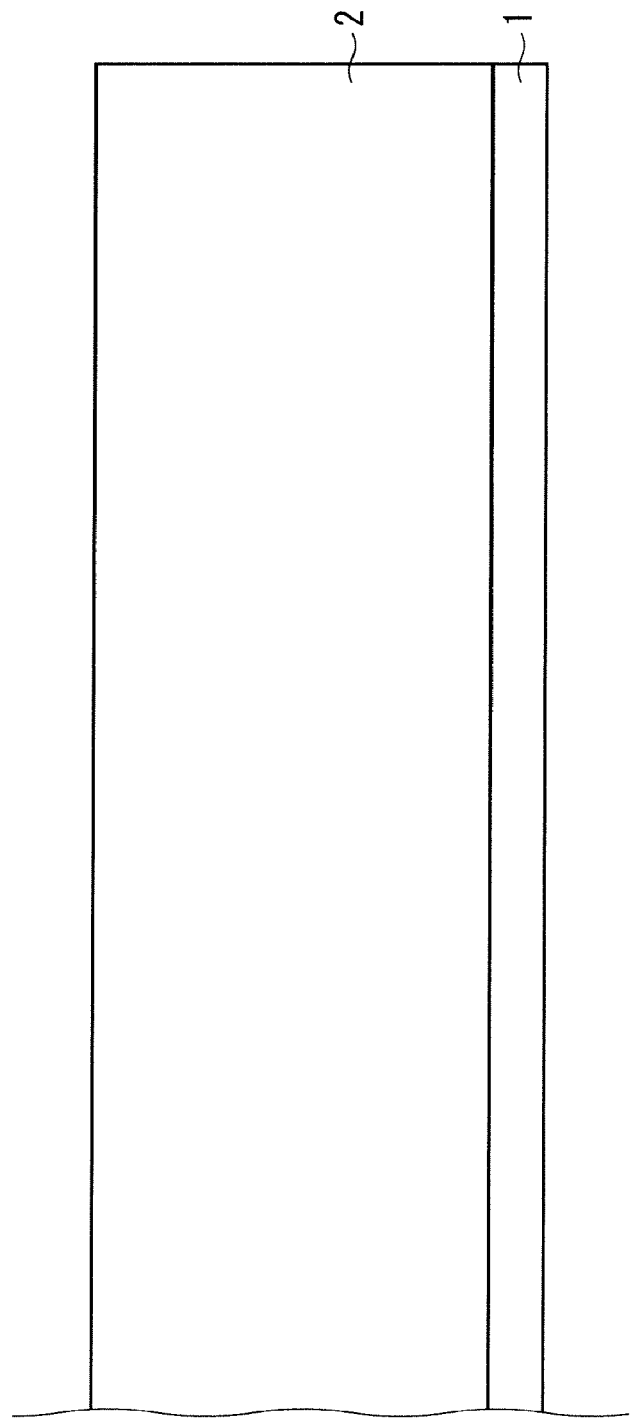
FIG. 4 A local sectional view schematically illustrating a step of a method of manufacturing the SBD of FIG. 1.

Referring to FIG. 4, the drift layer 2 is formed on semiconductor substrate 1. For that purpose, for example, epitaxial growth by a chemical vapor deposition (CVD) method is performed.

Figure 5:
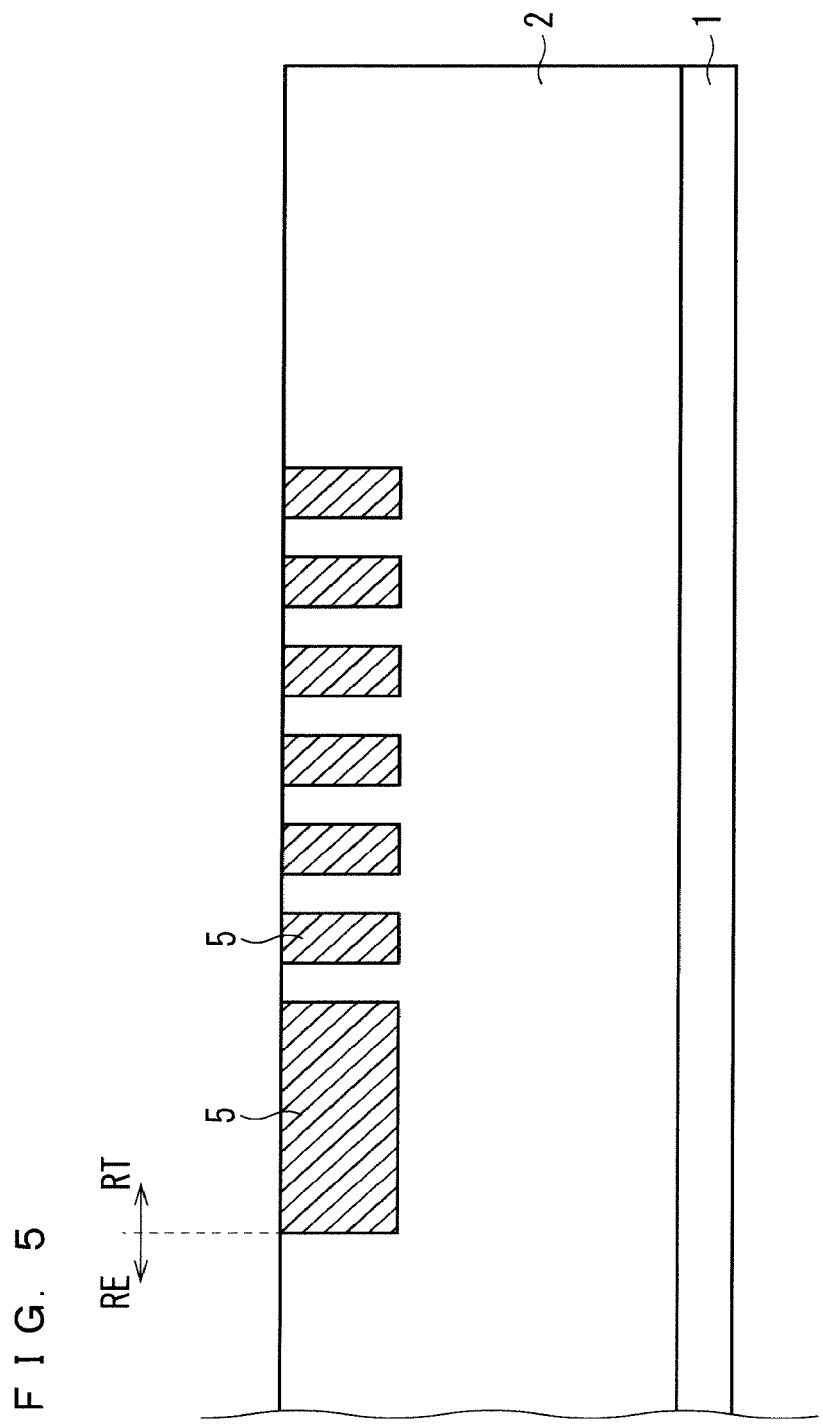
FIG. 5 A local sectional view schematically illustrating a step of the method of manufacturing the SBD of FIG. 1.

Referring to FIG. 5, the FLR regions 5 are formed. For that purpose, impurity ions such as aluminum or boron for obtaining p-type, that is, acceptor ions are implanted on the surface side of the drift layer 2. The depth of the ion implantation does not exceed the thickness of the drift layer 2, and is, for example, 0.2 μm or more and 3 μm or less, or so.

Figure 6:
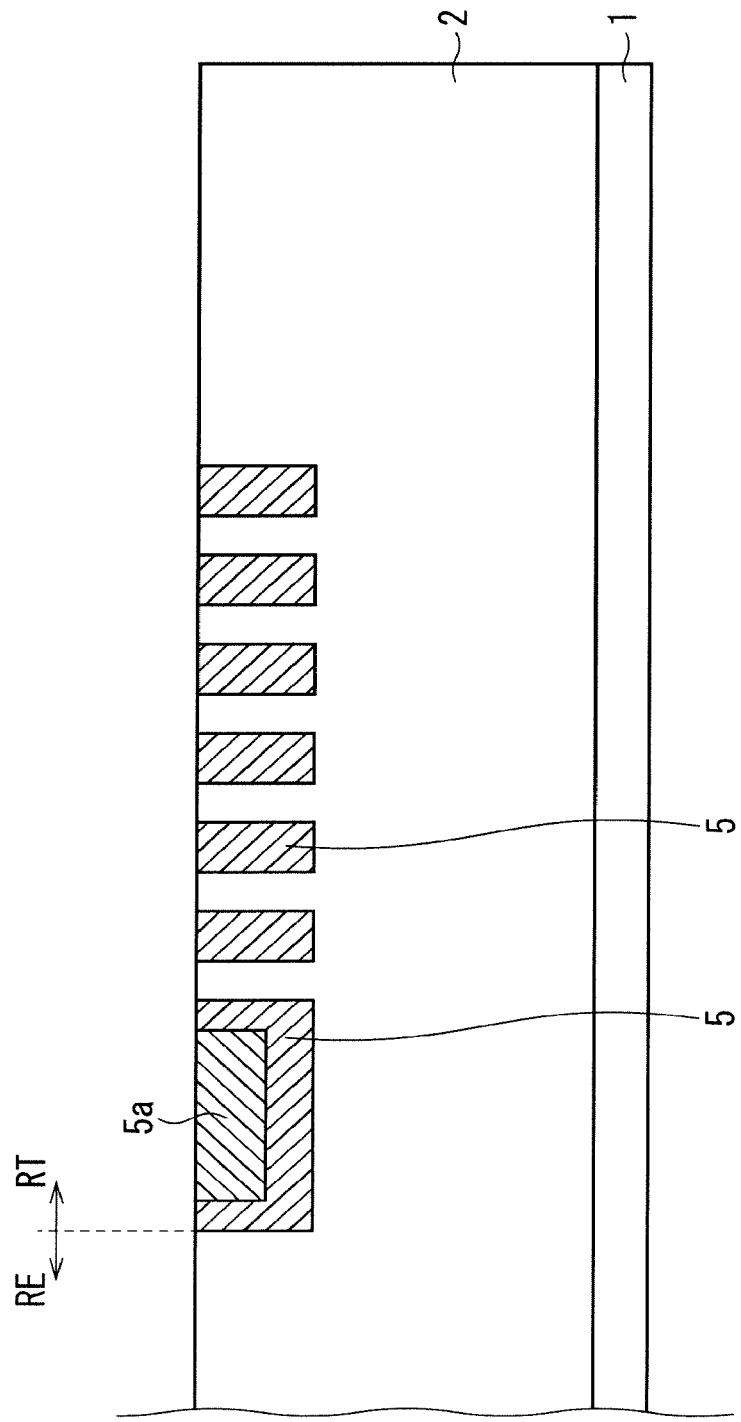
FIG. 6 A local sectional view schematically illustrating a step of the method of manufacturing the SBD of FIG. 1.
Figure 13:
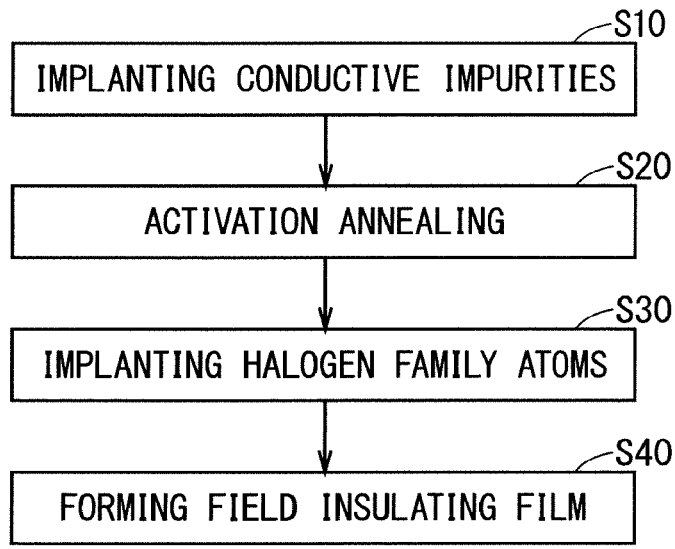
FIG. 13 A flow chart illustrating the method of manufacturing the SBD of FIG.

Referring to FIG. 6, the high-concentration region 5a is formed on the one of the FLR regions 5 which is at the innermost circumference. To this end, local ion implantation using an implantation mask is performed on the surface of the drift layer 2 where the FLR region 5 has been formed (FIG. 13: step S10). The depth of the ion implantation is smaller than the depth of the FLR region 5. As the implantation mask, a resist mask or a hard mask formed by photomechanical process may be used. The hard mask may be formed by depositing a silicon dioxide film by CVD method and patterning the film by dry etching. Aluminum or boron is applied to the ion to be implanted, for example. The high-concentration region 5a has a particularly high impurity concentration; therefore, the ion implantation temperature thereof is preferably 150° C. or higher. As a result, the high-concentration region 5a having a low sheet resistance is formed.

Next, high-temperature annealing (activation annealing) to electrically activate the implanted conductive impurities is performed (FIG. 13: step S20). Activation annealing is performed in an inert atmosphere such as an argon atmosphere at a temperature range of 1500° C. to 2000° C. for a period of 30 seconds to 1 hour. At the time of activation annealing, the surface of the drift layer 2 may be covered with a carbon film to prevent surface roughness.

Figure 7:
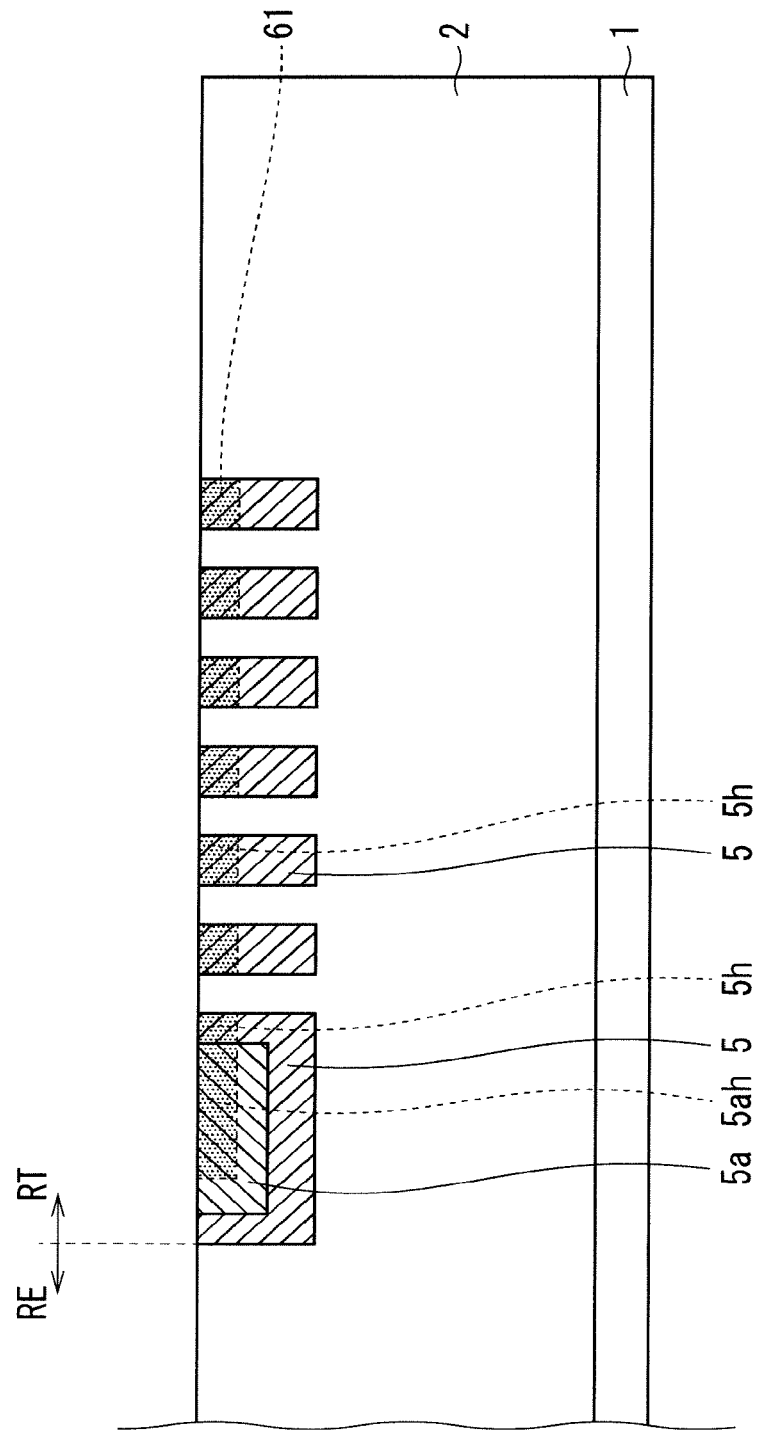
FIG. 7 A local sectional view schematically illustrating a step of the method of manufacturing the SBD of FIG. 1.

Referring to FIG. 7, halogen family atoms are implanted into the surface portions of the FLR regions 5 (FIG. 13: step S30). Accordingly, the halogen-containing field limiting ring parts 5h are formed. In order to selectively implant the halogen family atoms onto the FLR regions 5, an implantation mask may be used. The implantation mask can be formed by photomechanical process. Implantation is performed by ion implantation. The acceleration voltage for ion implantation is, for example, 30 keV or more and 700 keV or less. The ion implantation amount is determined so that the negative fixed charge density due to the implanted halogen family atoms is $1\times10^{12}$ cm$^2$ or more and $1\times10^{13}$ cm$^{-2}$, preferably $2\times10^{12}$ cm$^{-2}$, or so. The implantation depth of the halogen family atoms does not exceed the thickness of the FLR region 5 and is set to 0.2 μm or more and 1 μm or less, or so. Depending on the amount of negative fixed charge introduced, the ion implantation temperature may be 150° C. or higher.

Figure 8:
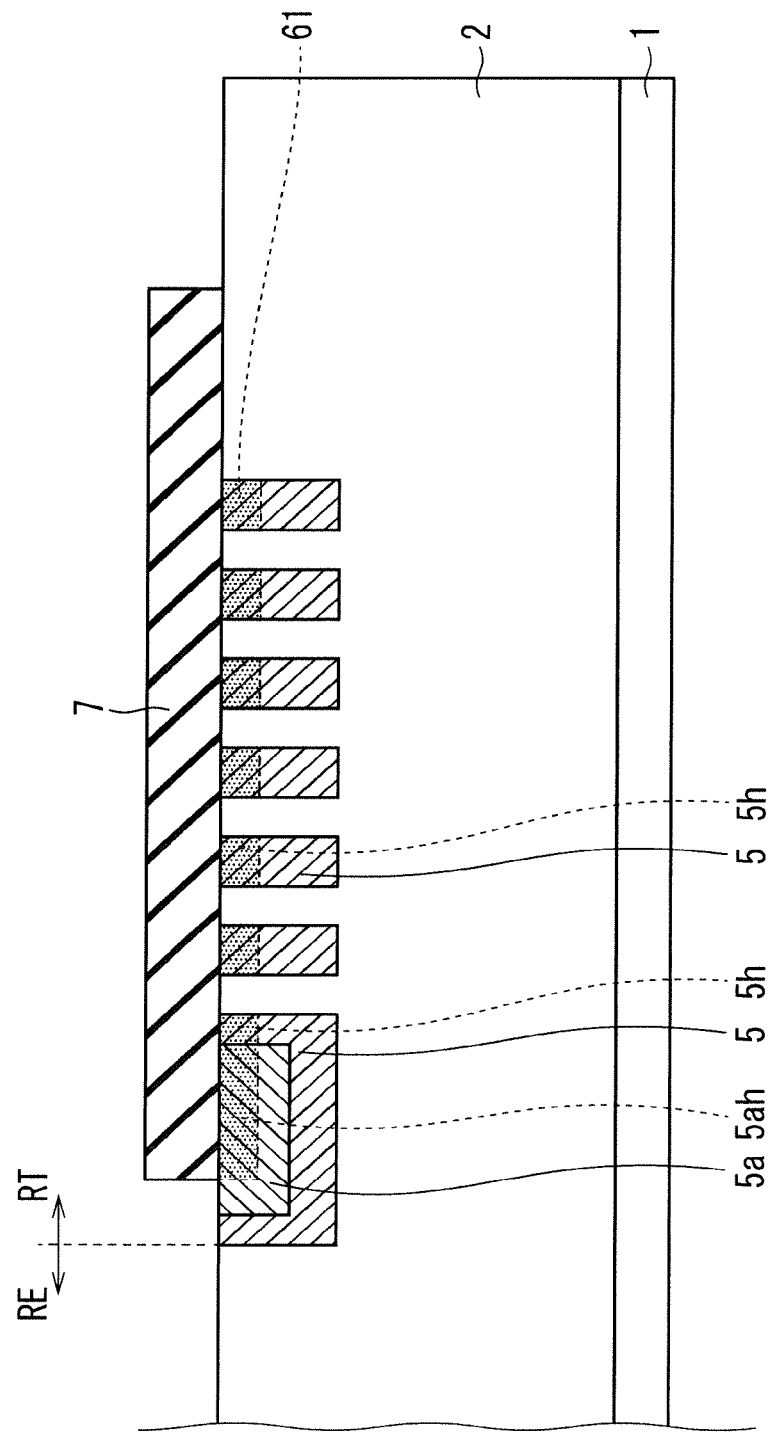
FIG. 8 A local sectional view schematically illustrating a step of the method of manufacturing the SBD of FIG. 1.

Referring to FIG. 8, the field insulating film 7 is formed (FIG. 13: step S40). To this end, a deposition process by the CVD method, a photomechanical process, and an etching process are performed.

Figure 9:
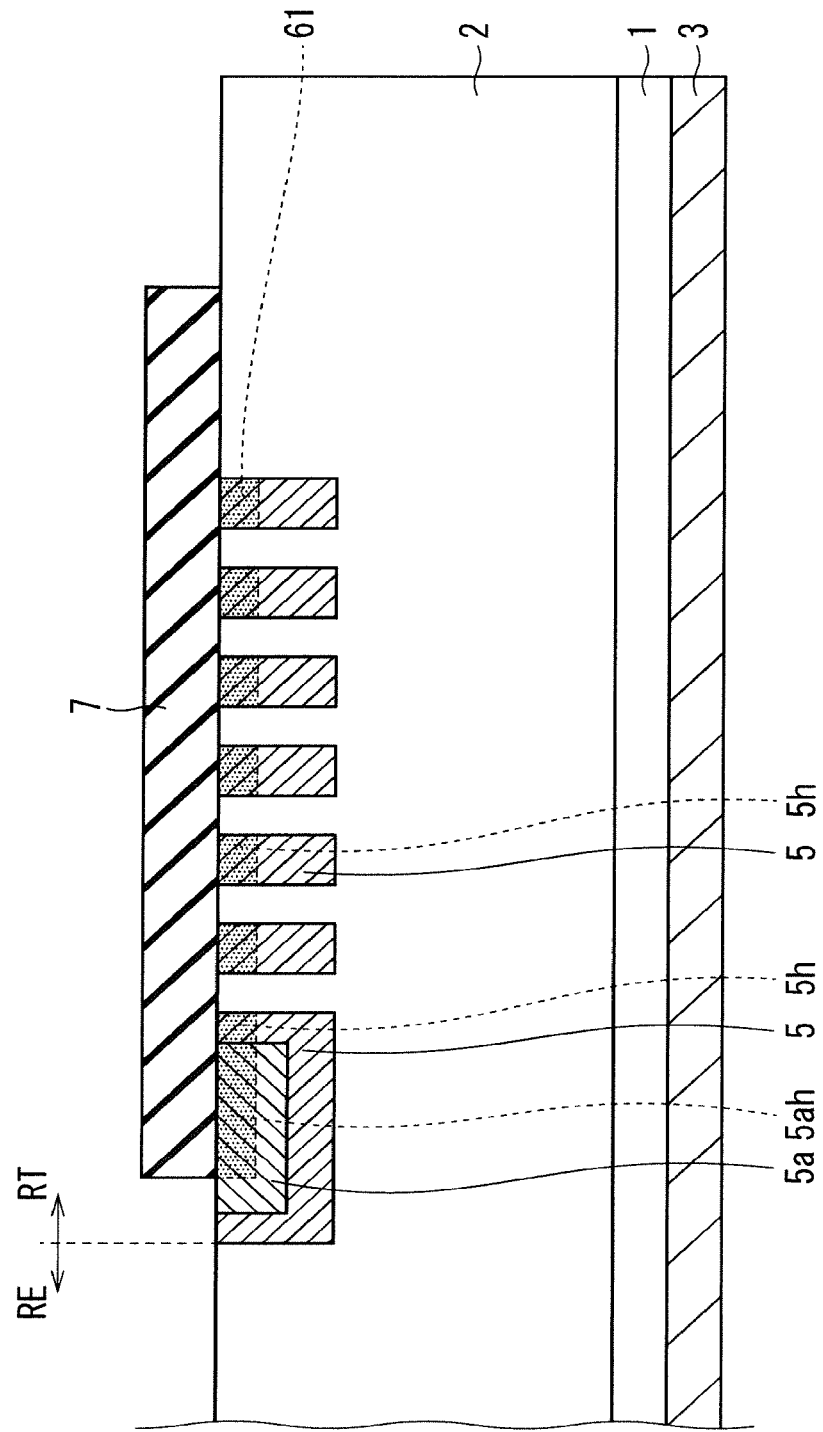
FIG. 9 A local sectional view schematically illustrating a step of the method of manufacturing the SBD of FIG. 1.

Next, referring to FIG. 9, the rear surface ohmic electrode 3 is formed on the lower surface of semiconductor substrate 1. Specifically, a metal film such as Ni is formed, and in order to obtain an ohmic connection, the metal film is subjected to a heat treatment at 600° C. or higher and 1100° C. or lower. The heat treatment may also contribute to recovering the crystallinity of the semiconductor damaged by the above-described ion implantation of halogen atoms.

Figure 10:
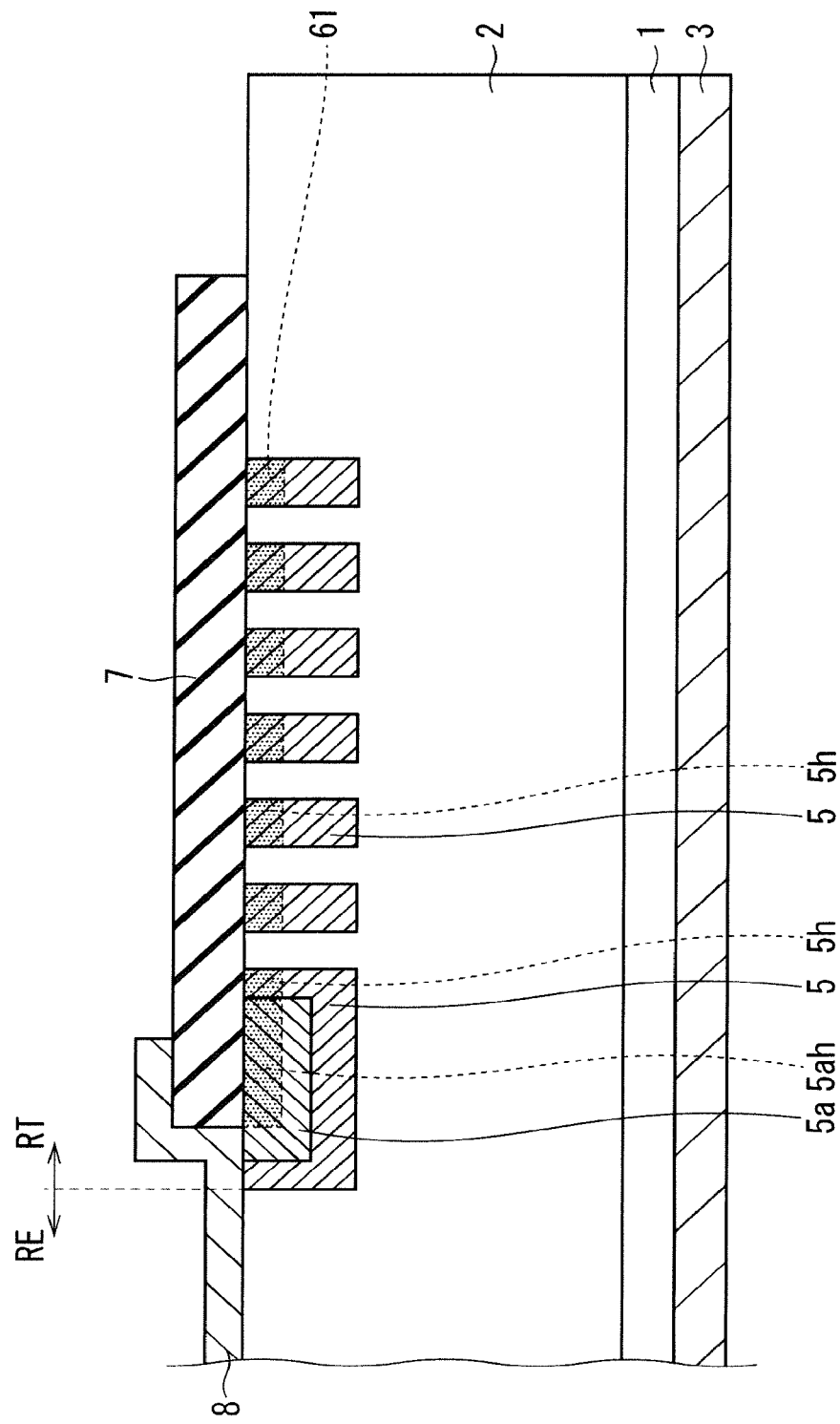
FIG. 10 A local sectional view schematically illustrating a step of the method of manufacturing the SBD of FIG. 1.

Next, referring to FIG. 10, the Schottky electrode 8 is formed. To this end, Ti, Ni, or Mo, for example, is deposited on the surface of the drift layer 2 by a sputtering method, and photomechanical process and etching processing are performed.

Figure 11:
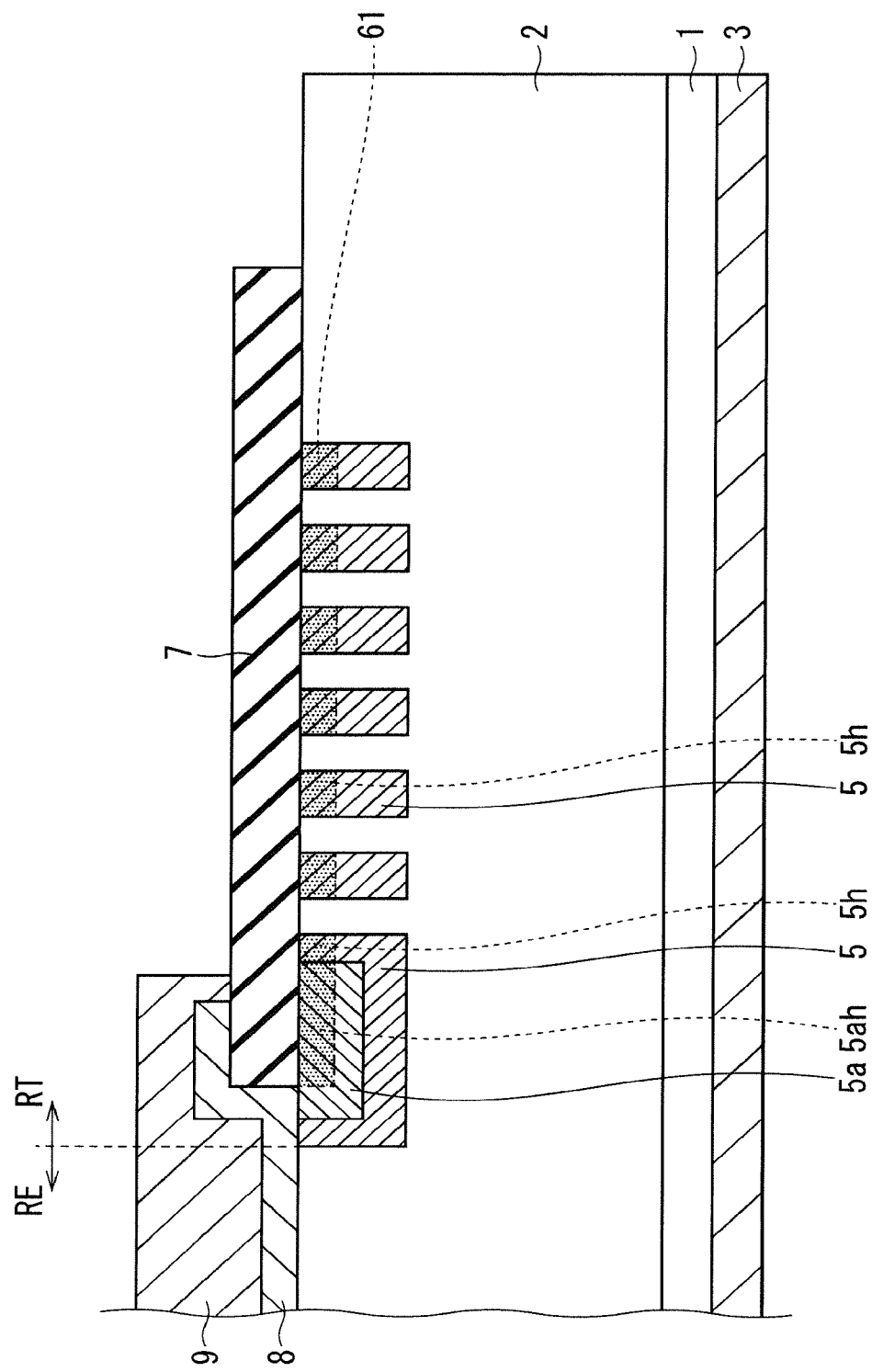
FIG. 11 A local sectional view schematically illustrating a step of the method of manufacturing the SBD of FIG. 1.

Next, referring to FIG. 11, the anode electrode 9 is formed on the Schottky electrode 8. To this end, Al, for example, is deposited on the surface of the Schottky electrode 8 by a sputtering method, and photomechanical process and etching processing are performed.

Figure 12:
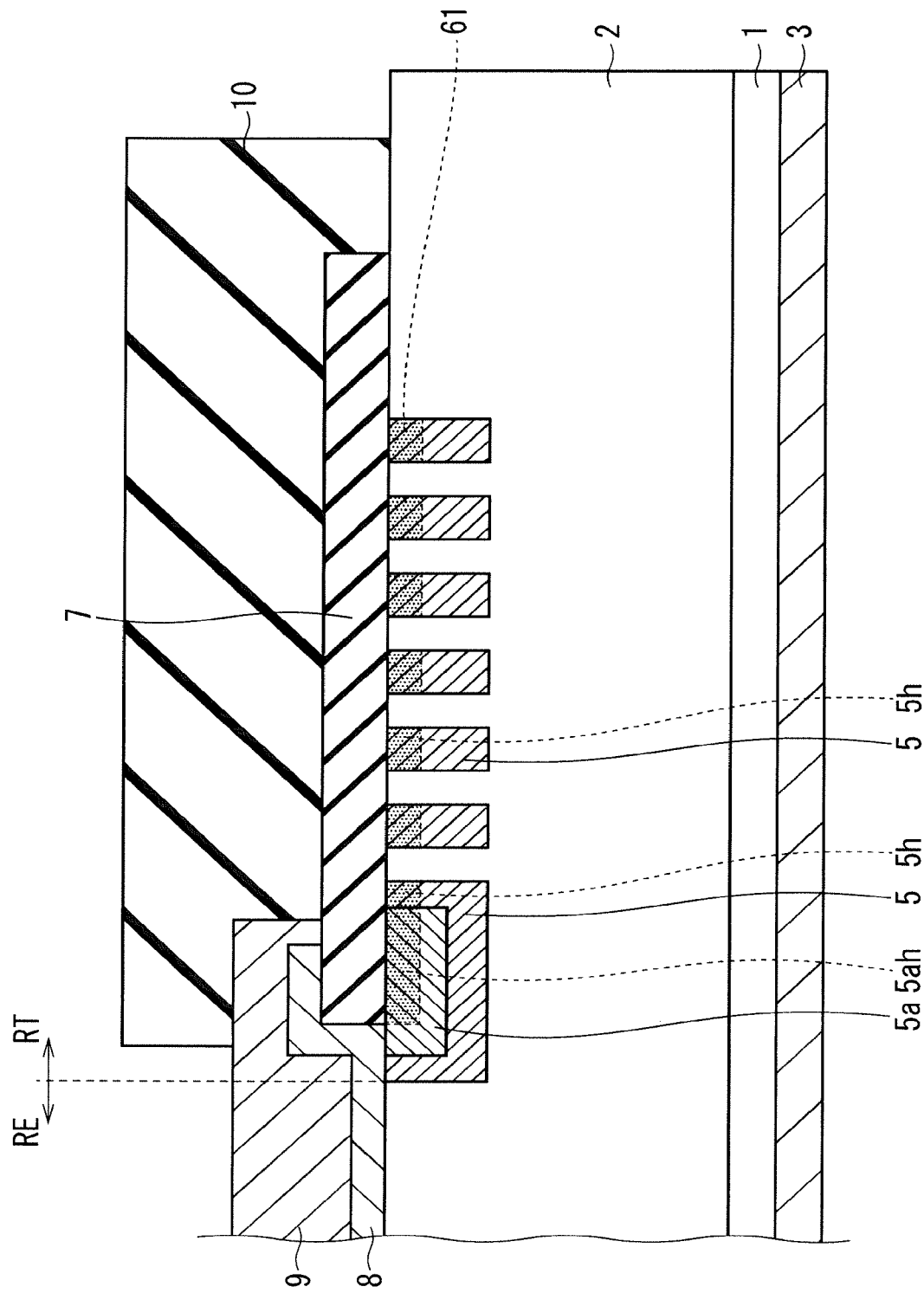
FIG. 12 A local sectional view schematically illustrating a step of the method of manufacturing the SBD of FIG. 1.

Next, referring to FIG. 12, the protective insulating film 10 is formed so as to cover a part of the anode electrode 9 and the drift layer 2. To this end, deposition of an insulator, a photomechanical process, and an etching process are performed.

Next, referring again to FIG. 3, the cathode electrode 4 is formed on the rear surface ohmic electrode 3. Specifically, a metal film of Ti, Ni, Ag, Au, or Al, for example, is formed by a sputtering method or an evaporation method. As a result, the SBD 101 is completed.

According to the present method of manufacturing, ion implantation of halogen family atoms (FIG. 13: step S30) is performed after activation annealing (FIG. 13: step S20), which is a high-temperature and long-time heat treatment. Thereby, desorption of the implanted halogen atoms at the activation annealing is avoided.

The fixed charge density formed at the interface between a region made of SiC and the field insulating film 7 depends on the material of the field insulating film 7. Therefore, the ion implantation amount of the halogen family atoms is adjusted according to the material of the field insulating film 7.

Embodiment 2

Figure 14:
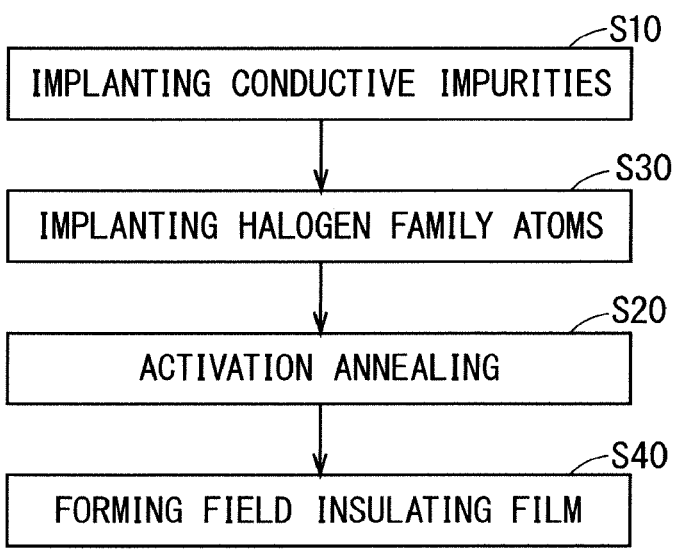
FIG. 14 A flow chart illustrating the method of manufacturing the SBD as a silicon carbide semiconductor device according to Embodiment 2.
Figure 15:
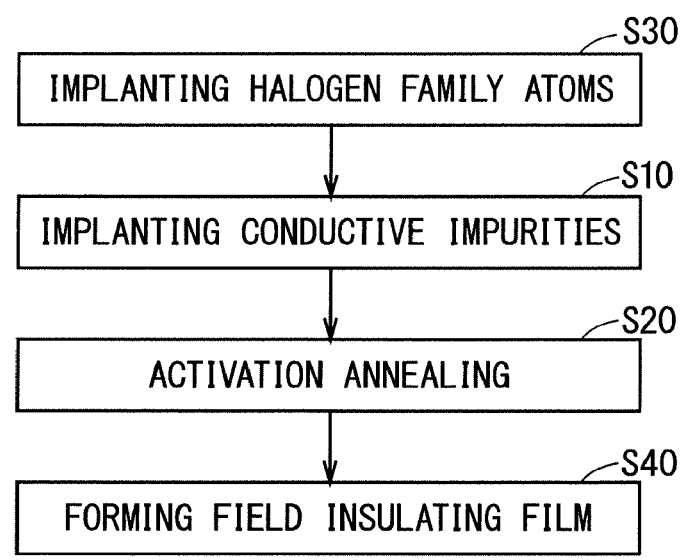
FIG. 15 A flow chart illustrating the method of manufacturing an SBD in Modification according to Embodiment 2.

In Embodiment 1 described above, ion implantation of halogen family atoms (FIG. 13: step S30) is performed after activation annealing (FIG. 13: step S20), but the order may be changed. Also in that case, the fixed charge layer 61 (FIG. 3) is formed and the effect thereof is obtained. Specifically, referring to FIG. 14, ion implantation of halogen family atoms (step S30) may be performed after implantation of conductive impurities (step S10) and before activation annealing (step S20). Or, referring to FIG. 15, ion implantation of halogen family atoms (step S30) may be performed after implantation of conductive impurities (step S10) and activation annealing (step S20).

Embodiment 3

Figure 16:
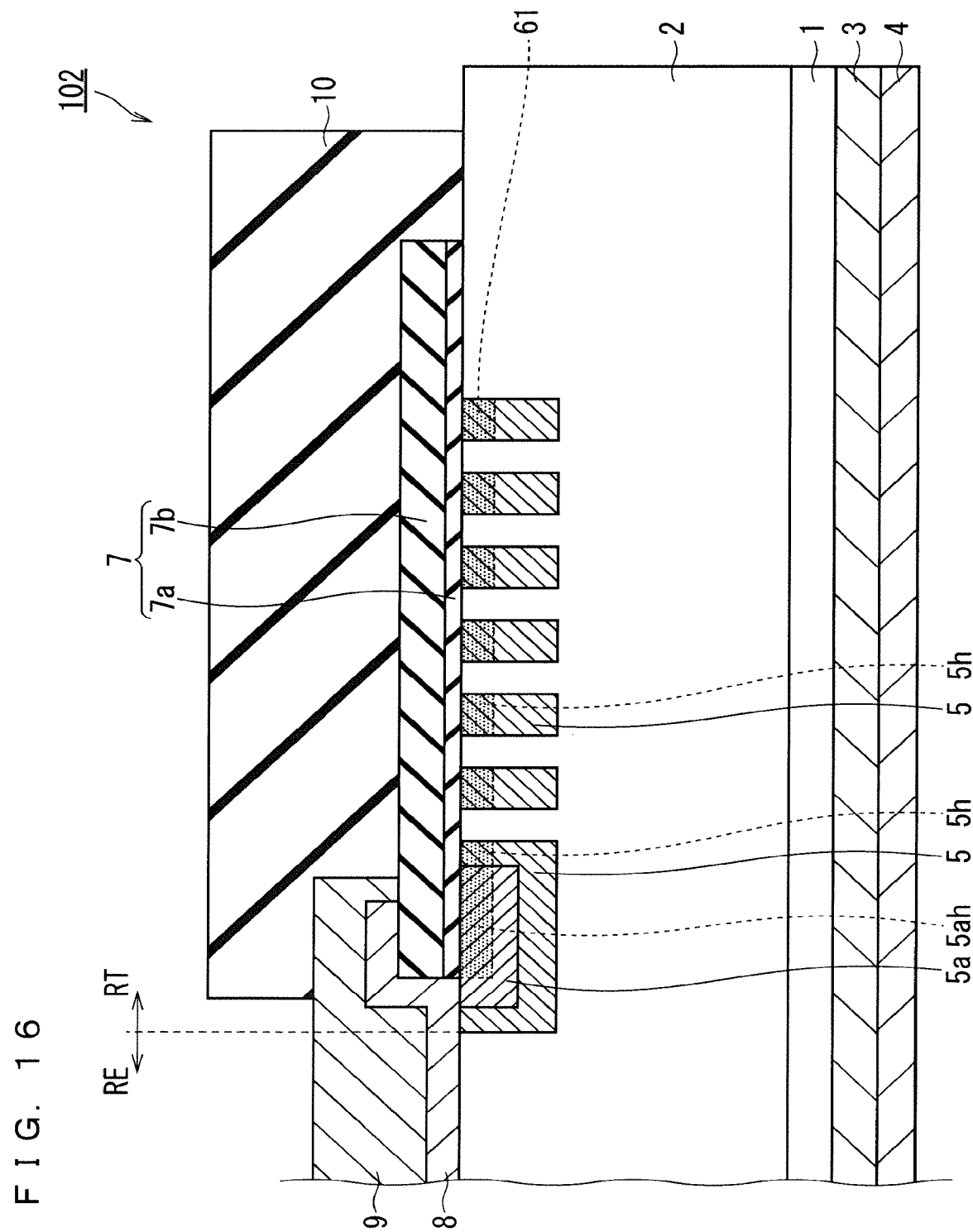
FIG. 16 A local sectional view schematically illustrating a configuration of an SBD as a silicon carbide semiconductor device according to Embodiment 3 of the present invention.

FIG. 16 is a local sectional view schematically illustrating a configuration of an SBD (silicon carbide semiconductor device) 102 according to Embodiment 3. In the SBD 102, the field insulating film 7 has a thermal oxide film 7a and a CVD film 7b (deposition film). The thermal oxide film 7a is provided on the terminal region RT and is in contact with the FLR regions 5 and the drift layer 2. The CVD film 7b is provided on the thermal oxide film 7a.

Referring to FIG. 17, in Embodiment 3, the step of forming the field insulating film 7 includes the step of forming the thermal oxide film 7a (step S41) and the step of forming the CVD film 7b (step S42). For example, in step S41, the thermal oxide film 7a having a film thickness of 10 nm to 50 nm is formed on the drift layer 2 by thermal oxidation in a dry atmosphere. This thermal oxidation process is performed in a temperature range of 1000° C. to 1200° C. This thermal oxidation step also serves as a step of recovering damaged crystallinity attributed to ion implantation of halogen family atoms for forming the fixed charge layer 61. In step S42, the CVD film 7b made of silicon dioxide is deposited on the thermal oxide film 7a by the CVD method. Thereafter, a pattern is imparted to a laminated body of the thermal oxide film 7a and the CVD film 7b by photomechanical process and etching.

The configuration other than the above is substantially the same as that of the above-described Embodiments 1 and 2, therefore, the same or corresponding elements are denoted by the same reference numerals, and description thereof will not be repeated.

Embodiment 4

Figure 18:
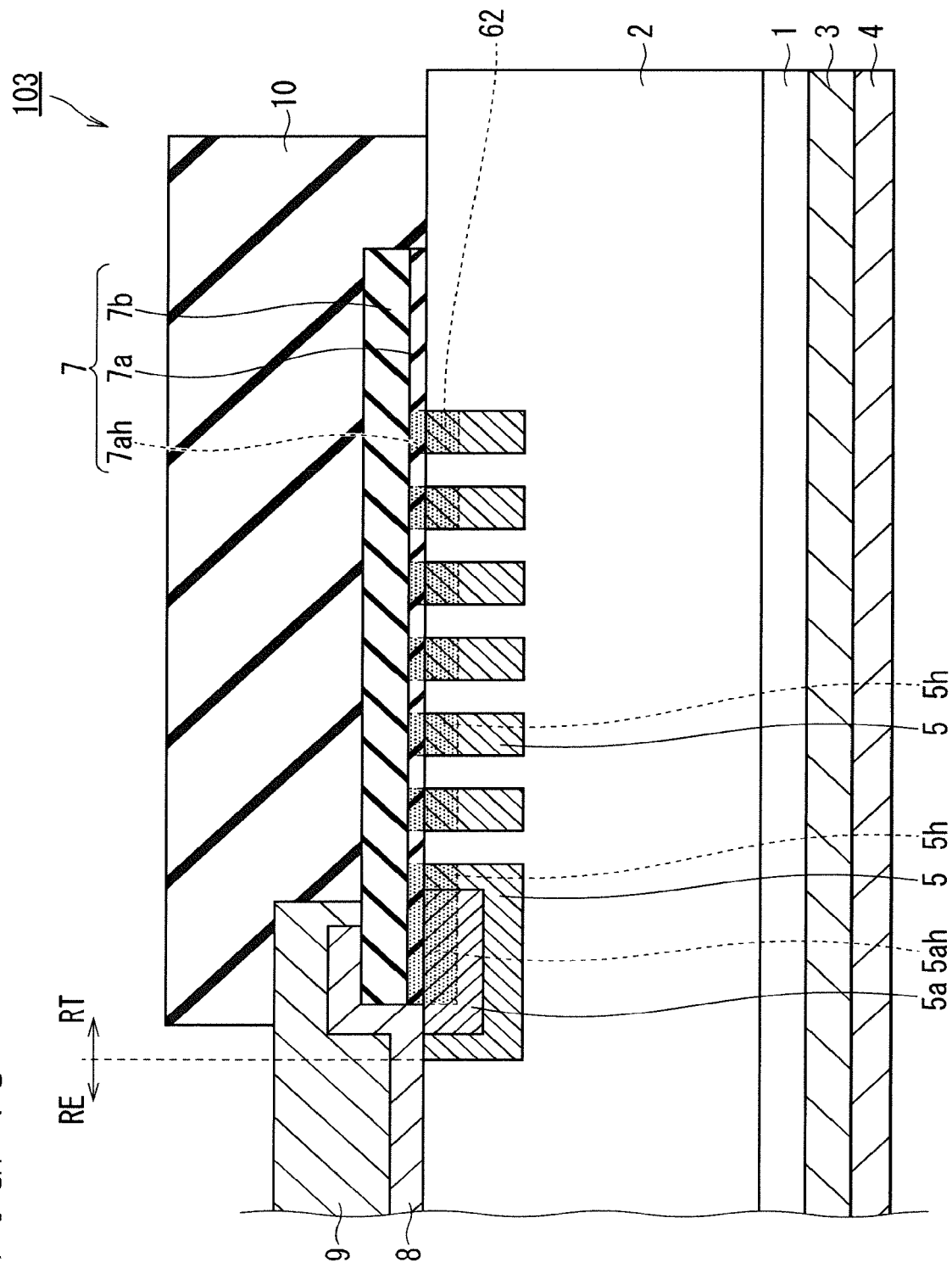
FIG. 18 A local sectional view schematically illustrating a configuration of an SBD as a silicon carbide semiconductor device according to Embodiment 4 of the present invention.

FIG. 18 is a local sectional view schematically illustrating a configuration of an SBD (silicon carbide semiconductor device) 103 according to Embodiment 4. As with the SBD 102 (FIG. 16: Embodiment 3), in the SBD 103, the field insulating film 7 also has a thermal oxide film 7a. In Embodiment 4, unlike Embodiment 3, the thermal oxide film 7a has a halogen-containing field insulating part 7ah. The halogen-containing field insulating part 7ah contains halogen family atoms and is located on the halogen-containing field limiting ring parts 5h. Therefore, in the SBD 103, a negative fixed charge layer 62 caused by halogen family atoms includes portions formed of the halogen-containing field limiting ring parts 5h and portions formed of the halogen-containing field insulating parts 7ah on the halogen-containing field limiting ring parts 5h.

Figure 19:
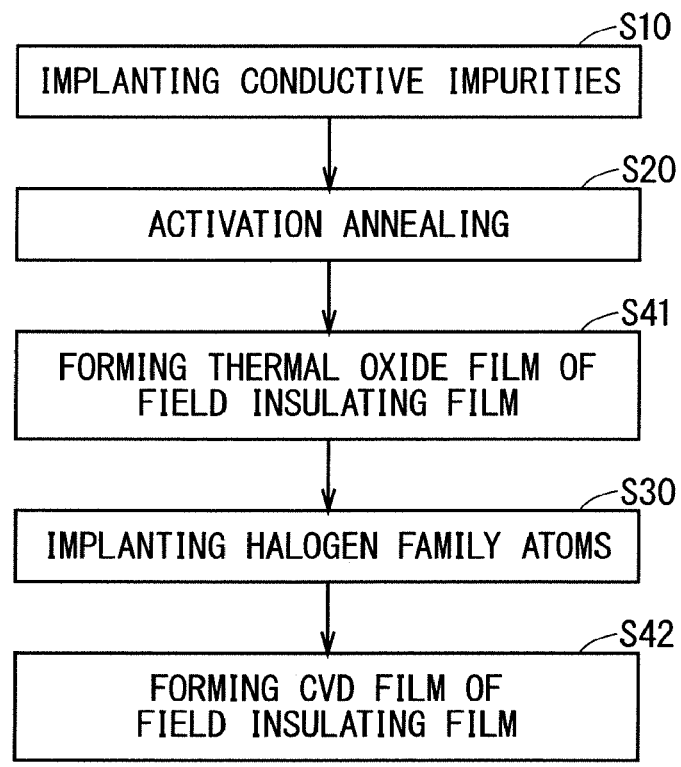
FIG. 19 A flow chart illustrating the method of manufacturing the SBD of FIG. 18.

Referring to FIG. 19, in Embodiment 4, unlike Embodiment 3, the implantation of halogen family atoms (step S30) is performed after the thermal oxide film 7a is formed (step S41). Accordingly, the halogen family atoms are implanted into the drift layer 2 through the thermal oxide film 7a. As a result, not only the halogen-containing field limiting ring parts 5h are formed but also the halogen-containing field insulating parts 7ah are formed in the thermal oxide film 7a. The CVD film 7b is formed on the thermal oxide film 7a. Thereafter, a pattern is imparted to a laminated body of the thermal oxide film 7a and the CVD film 7b by photomechanical process and etching.

The configuration other than the above is substantially the same as that of the above-described Embodiments 3, therefore, the same or corresponding elements are denoted by the same reference numerals, and description thereof will not be repeated.

According to Embodiment 4, the field insulating film 7 includes the halogen-containing field insulating parts 7a, which contains the halogen family atoms and locates on the halogen-containing field limiting ring parts 5h. In this case, the halogen-containing field limiting ring parts 5h are formed by ion implantation through the field insulating film 7, specifically, the thermal oxide film 7a. As a result, the halogen family atoms are prevented from desorbing from the halogen-containing field limiting ring parts 5h due to the influence of forming the field insulating film 7, in particular, the influence of the heat treatment.

It should be noted that, in Embodiment 4, the heat treatment for forming the thermal oxide film 7a does not serve as a step of recovering damaged crystallinity attributed to ion implantation of the halogen family atoms. Meanwhile, the heat treatment for forming the rear surface ohmic electrode 3 is performed after the implantation of the halogen family atoms; therefore, this heat treatment contributes to the recovery of crystallinity also in Embodiment 4.

Embodiment 5

Figure 20:
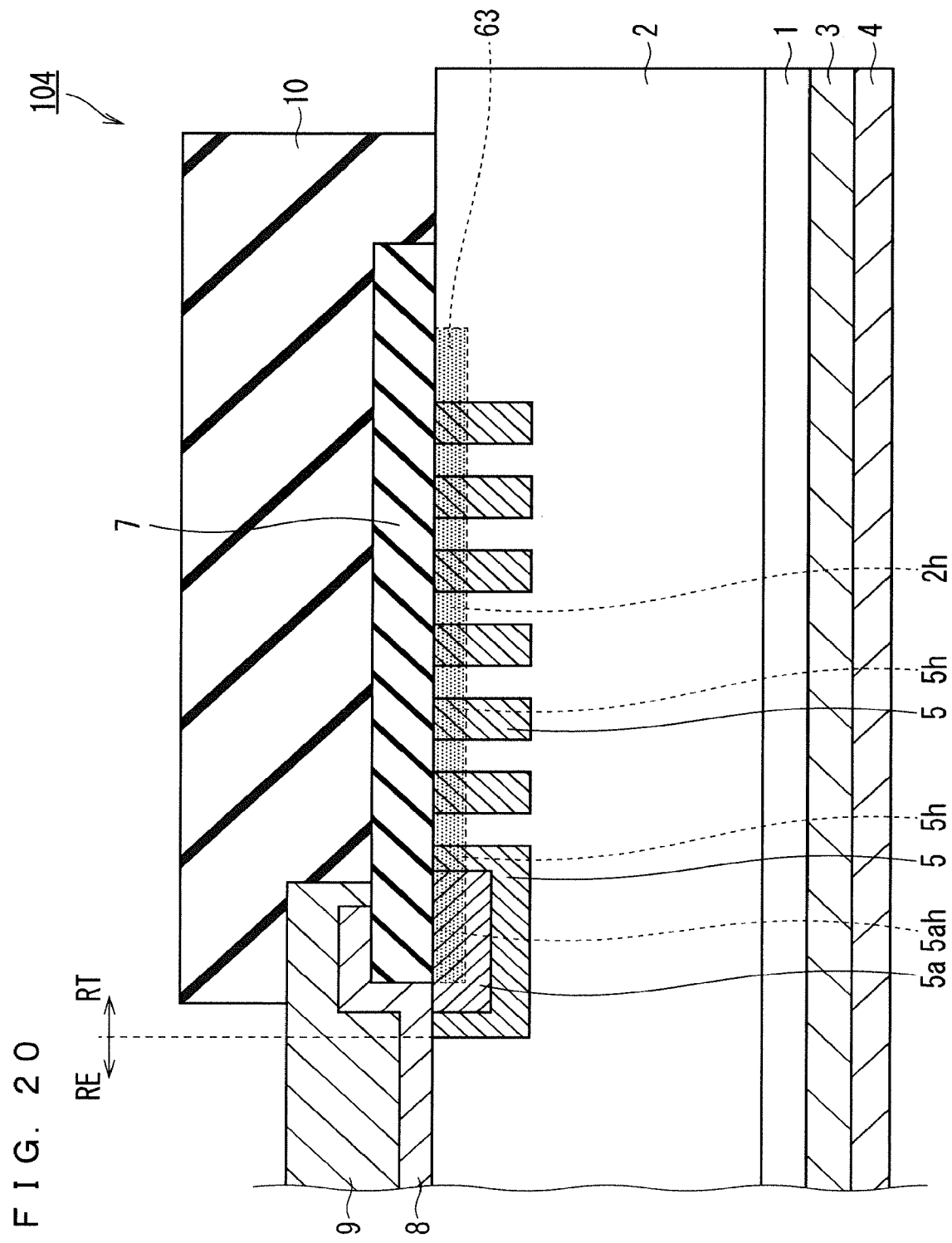
FIG. 20 A local sectional view schematically illustrating a configuration of an SBD as a silicon carbide semiconductor device according to Embodiment 5 of the present invention.

FIG. 20 is a local sectional view schematically illustrating a configuration of an SBD (silicon carbide semiconductor device) 104 according to Embodiment 5. In the SBD 104, the drift layer 2 has halogen-containing semiconductor parts 2h. Each of the halogen-containing semiconductor parts 2h contains halogen family atoms and is in contact with the field insulating film 7 between the FLR regions 5. Therefore, in the SBD 104, a negative fixed charge layer 63 caused by halogen family atoms includes portions formed of the halogen-containing field limiting ring parts 5h and portions formed of the halogen-containing semiconductor parts 2h adjacent to the halogen-containing field limiting ring parts 5h.

The configuration other than the above is substantially the same as that of the above-described Embodiments 1, therefore, the same or corresponding elements are denoted by the same reference numerals, and description thereof will not be repeated. The same effects as Embodiment 1 are also obtained with Embodiment 5.

Further, according to Embodiment 5, the negative fixed charge layer 63 caused by halogen family atoms has the halogen-containing semiconductor parts 2h in the drift layer 2. As a result, a positive charge attributed to donor ions in the drift layer 2 are compensated. Therefore, the donor concentration in the drift layer 2 effectively decreases. Therefore, a depletion layer easily spreads into the drift layer 2. Therefore, electric field concentration at the edge portions of the FLR regions 5 is relaxed. The electric field concentration at the edge portions of the FLR regions 5 is particularly likely to occur when impurity concentration of the FLR regions 5 is increased due to ion implantation variation; robustness against such process variation is improved according to Embodiment 5.

Even when a positive charge enters the interface between the field insulating film 7 and the drift layer 2 from the outside, the electric flux lines from the positive charge are terminated by a negative charge in the halogen-containing semiconductor parts 2h. Accordingly, suppression of fluctuation in the breakdown voltage attributed to the positive electric charge from the outside is ensured without changing the implantation amount of acceptor ions composing the FLR regions 5.

Figure 21:
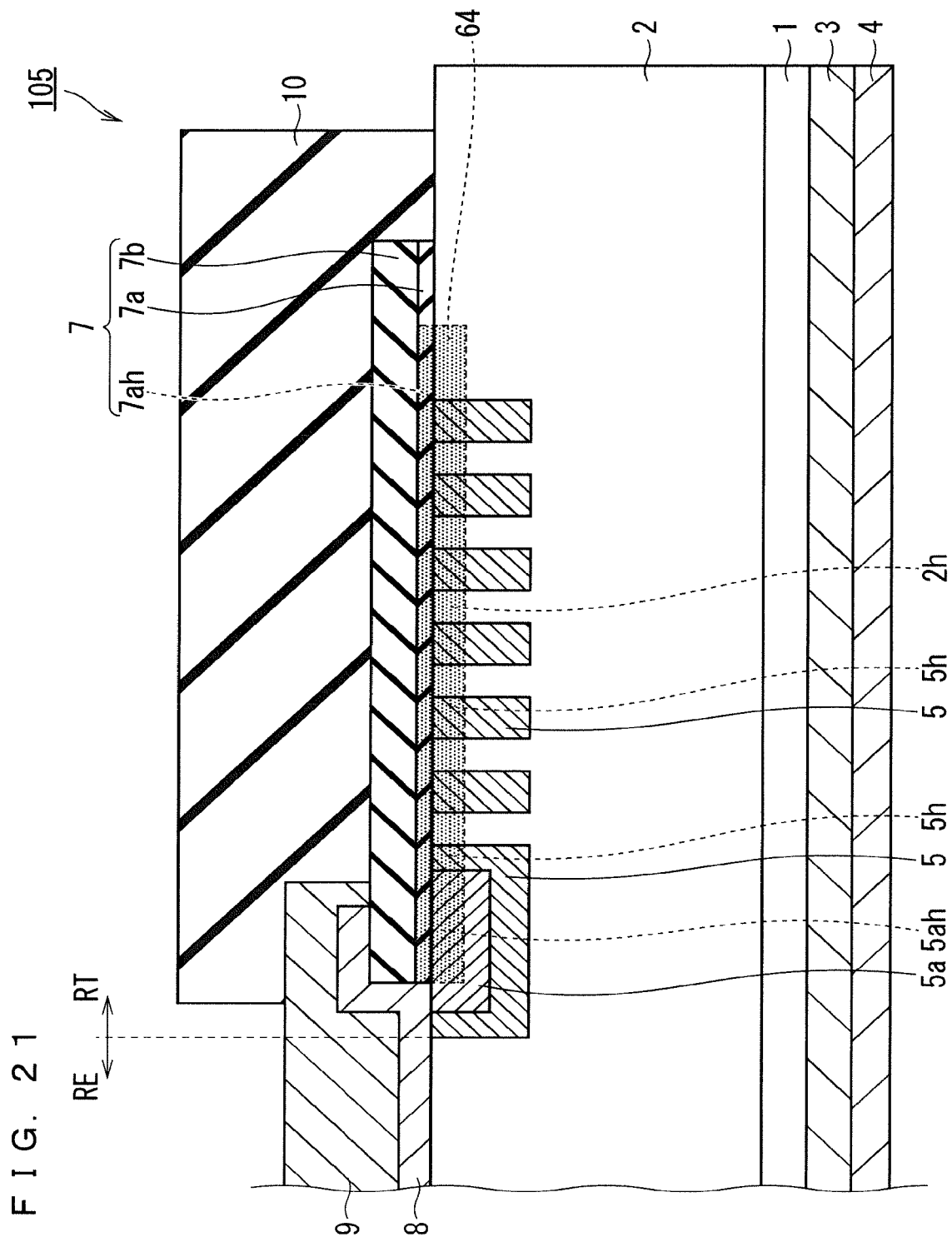
FIG. 21 A local sectional view schematically illustrating the configuration of an SBD as the silicon carbide semiconductor device according to Embodiment 5 of the present invention.

Referring to FIG. 21, in an SBD (silicon carbide semiconductor device) 105 of Modification, as in Embodiment 4, the field insulating film 7 has a thermal oxide film 7a and a CVD film 7b, and a thermal oxide film 7a has a halogen-containing field insulating part 7ah. Therefore, in the SBD 105, a negative fixed charge layer 64 caused by halogen family atoms includes a portion formed of the halogen-containing field insulating part 7ah. It should be noted that, as in Embodiment 3, the halogen-containing field insulating part 7ah may not be provided in the thermal oxide film 7a.

Embodiment 6

Figure 22:
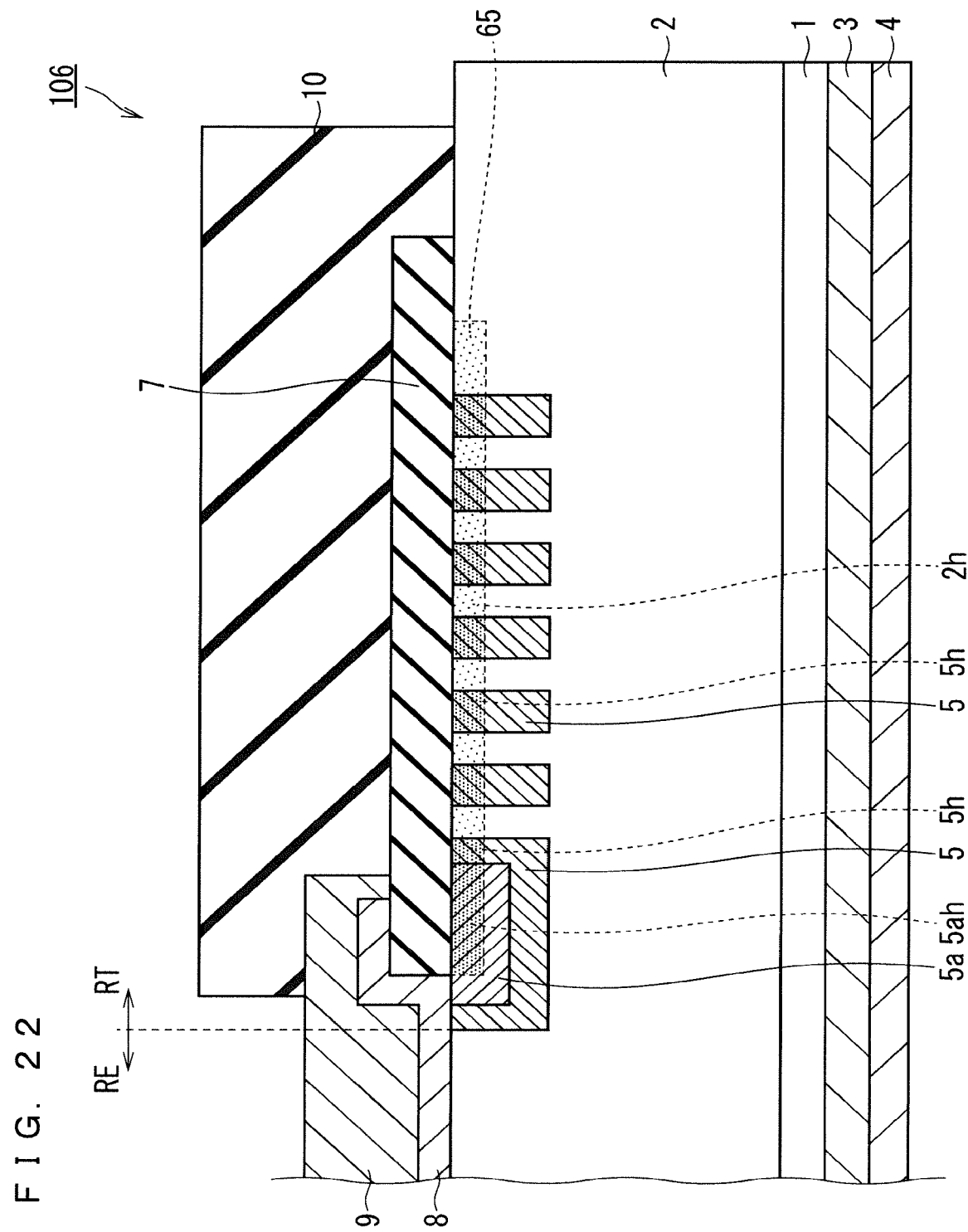
FIG. 22 A local sectional view schematically illustrating a configuration of an SBD as a silicon carbide semiconductor device according to Embodiment 6 of the present invention.

FIG. 22 is a local sectional view schematically illustrating a configuration of an SBD (silicon carbide semiconductor device) 106 according to Embodiment 6. In the SBD 106, each halogen-containing semiconductor part 2h has a larger negative fixed charge density than the negative fixed charge density of each halogen-containing field limiting ring part 5h. Therefore, in the SBD 106, a negative fixed charge layer 65 caused by halogen family atoms includes portions formed of the halogen-containing field limiting ring parts 5h and portions formed of the halogen-containing semiconductor parts 2h adjacent to the halogen-containing field limiting ring parts 5h, and the latter portions have a larger negative fixed charge density. It should be noted that the fixed charge density of any part of the fixed charge layer 65 is preferably in the range of $1\times10^{12}$ cm$^{-2}$ or more and $1\times10^{13}$ cm$^{-2}$ or less.

The dose amount for forming the halogen-containing semiconductor parts 2h is preferably larger than the dose amount for forming the halogen-containing field limiting ring parts 5h. In other words, the halogen family atom density per unit area in each halogen-containing semiconductor part 2h is preferably larger than the halogen family atom density per unit area in each halogen-containing field limiting ring part 5h.

According to Embodiment 6, each halogen-containing semiconductor part 2h has a larger negative fixed charge density than the negative fixed charge density of each halogen-containing field limiting ring part 5h. Accordingly, the effect of relaxing the electric field concentration at each edge portion of the FLR region 5 described in Embodiment 5 is enhanced. Also, the effect of suppressing the fluctuation of the breakdown voltage attributed to the positive charge from the outside described in Embodiment 5 is enhanced.

Figure 23:
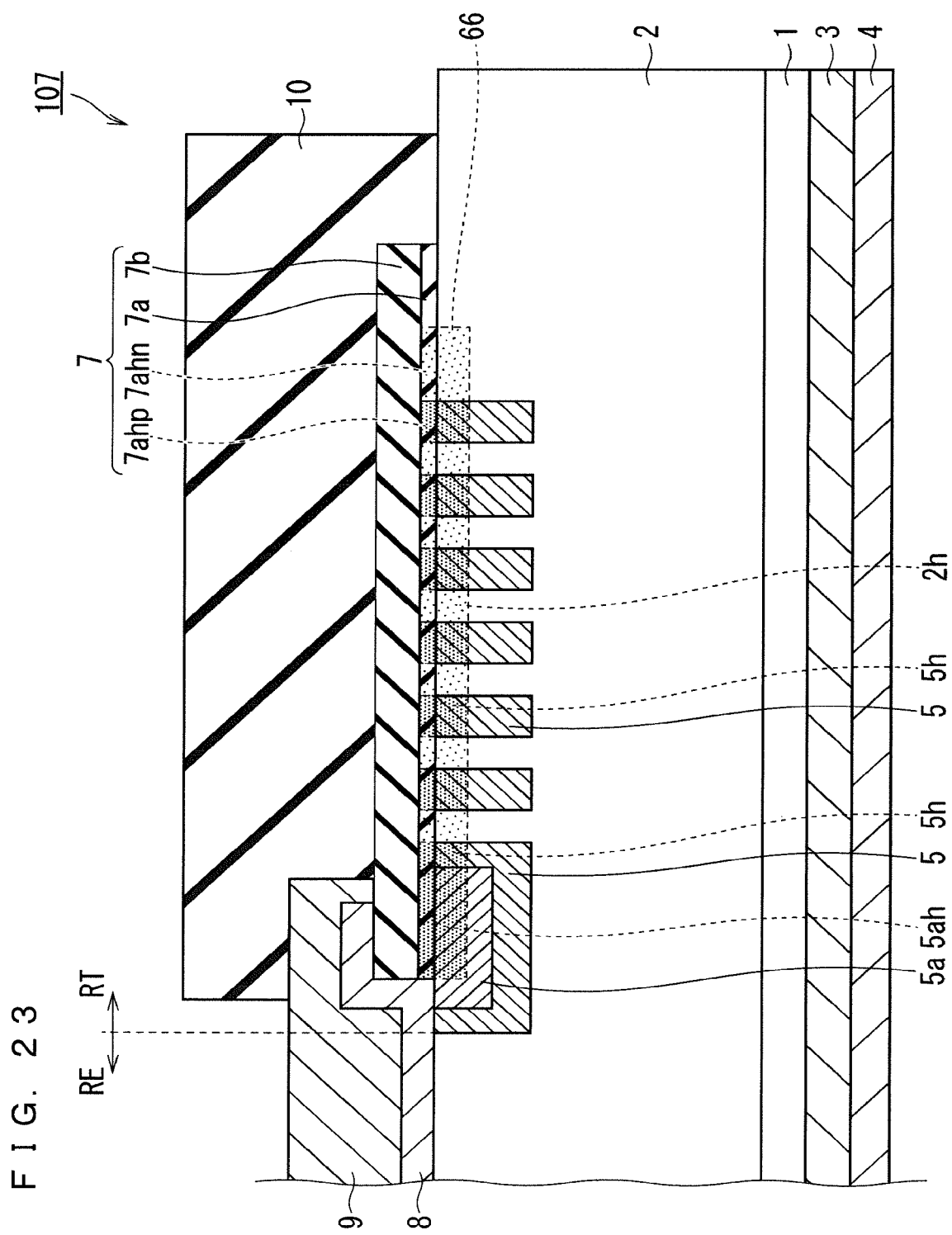
FIG. 23 A local sectional view schematically illustrating the configuration of an SBD as the silicon carbide semiconductor device according to Embodiment 6 of the present invention.

Referring to FIG. 23, in an SBD (silicon carbide semiconductor device) 107 of Modification, as in Embodiment 4, the field insulating film 7 has a thermal oxide film 7a and a CVD film 7b. The thermal oxide film 7a has a halogen-containing field insulating part forming a part of the negative fixed charge layer 66 caused by halogen family atoms. The halogen-containing field insulating part has halogen-containing field insulating parts 7ahp on the halogen-containing field limiting ring parts 5h and halogen-containing field insulating parts 7ahn on the halogen-containing semiconductor parts 2h. The negative fixed charge density of each halogen-containing field insulating part 7ahn is larger than the negative fixed charge density of each halogen-containing field insulating part 7ahp. It should be noted that, as in Embodiment 3, the halogen-containing field insulating parts 7ahp and the halogen-containing field insulating parts 7ahn may not be provided in the thermal oxide film 7a.

Embodiment 7

Figure 24:
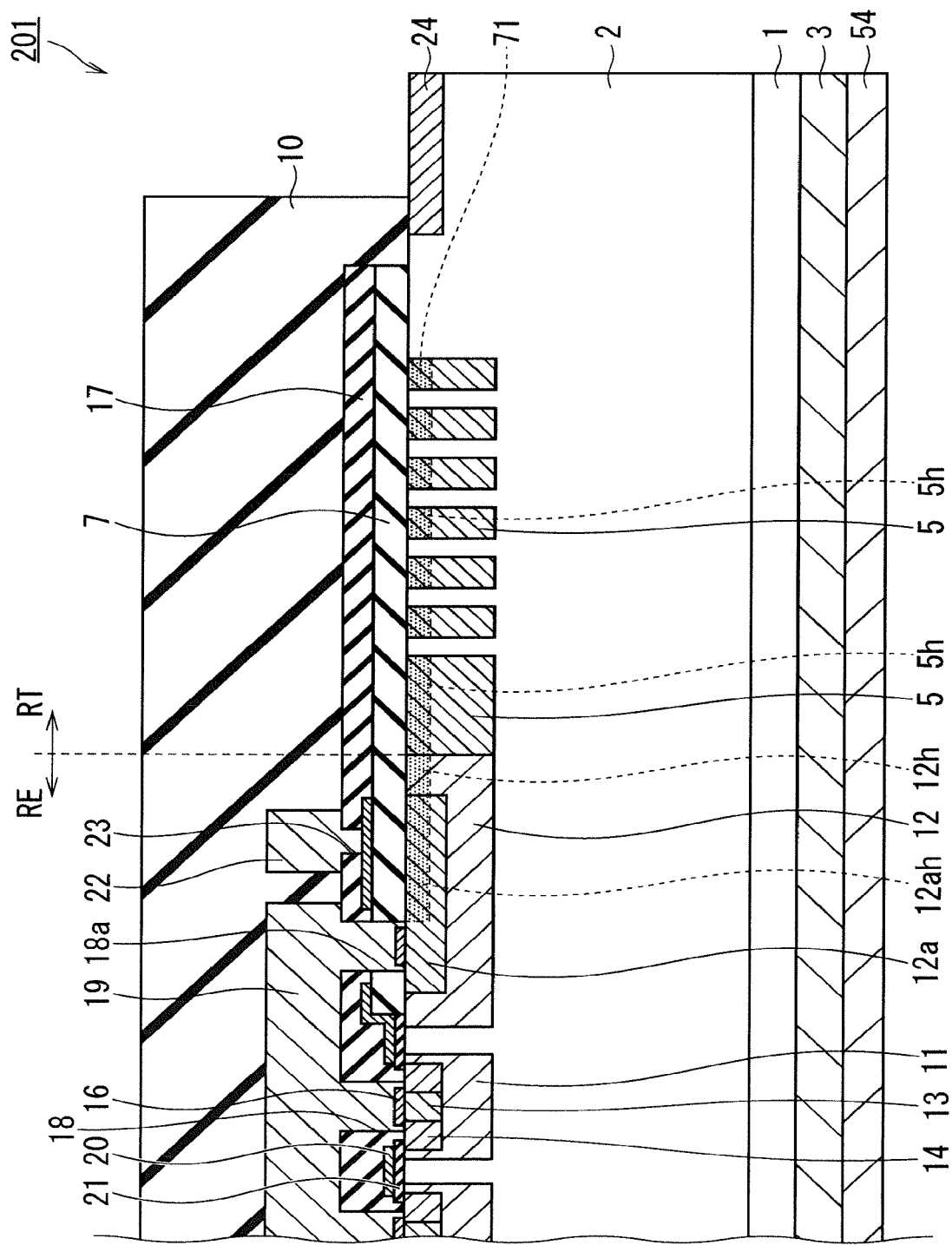
FIG. 24 A local sectional view schematically illustrating a configuration of a MOSFET as a silicon carbide semiconductor device according to Embodiment 7 of the present invention.

FIG. 24 is a local sectional view schematically illustrating a configuration of a MOSFET (silicon carbide semiconductor device) 201 according to Embodiment 7. The MOSFET 201 includes, similarly to the SBD 101 (FIG. 3: Embodiment 1), a semiconductor substrate 1, a drift layer 2, a rear surface ohmic electrode 3, a plurality of FLR regions 5, a field insulating film 7, and a protective insulating film 10. Similarly to the SBD 101, in the MOSFET 201, the negative fixed charge layer 71 is formed by the halogen-containing field limiting ring parts 5h in the FLR regions 5. Accordingly, similarly to Embodiment 1, the robustness of the breakdown voltage performance is improved.

The MOSFET 201 further includes a well region 11, a terminal well region 12, a high-concentration well region 13, a source region 14, a source contact electrode 16, an interlayer insulating film 17, a source electrode 19, a gate electrode 20, a gate insulating film 21, a gate wiring 22, a field stop region 24, and a drain electrode 54.

The terminal well region 12 is provided on a portion adjacent to the terminal region RT in the element region RE of the drift layer 2. The terminal well region 12 is separated from the semiconductor substrate 1 and has a depth of 0.2 μm to 3 μm, or so. The terminal well region 12 is disposed adjacent to the inner side of the one of the FLR regions 5 which is at the innermost circumference. The terminal well region 12 is made of SiC. The terminal well region 12 has p-type by addition of an acceptor. As the acceptor, aluminum or boron, for example, is used. The terminal well region 12 has the impurity concentration higher than the impurity concentration of the FLR regions 5. The terminal well region 12 has a high-concentration terminal well region 12a provided in a well shape. The high-concentration terminal well region 12a has a higher impurity concentration in comparison with the terminal well region 12 except the high-concentration terminal well region 12a.

The negative fixed charge layer 71 may include a portion formed of the halogen-containing terminal well part 12h in addition to the portion formed of the halogen-containing field limiting ring parts 5h. The halogen-containing terminal well portion 12h is a portion in contact with the field insulating film 7 and containing halogen family atoms in the terminal well region 12. The halogen-containing terminal well portion 12h may include a halogen-containing high-concentration terminal well portion 12ah which is a part of the high-concentration terminal well region 12a.

The well region 11 is provided on the element region RE of the drift layer 2 and is disposed corresponding to each unit cell of the MOSFET. The well region 11 is separated from the semiconductor substrate 1 and has a depth of 0.2 μm to 3 μm, or so. The well region 11 is made of SiC. The well region 11 has p-type by addition of an acceptor. As the acceptor, aluminum or boron, for example, is used. The well region 11 has the impurity concentration higher than the impurity concentration of the FLR regions 5, and has a value in the range of $1\times10^{15}$ cm$^{-3}$ to $1\times10^{19}$ cm$^{-3}$. The well region 11 may have the same impurity concentration as the impurity concentration of the terminal well region 12. On the well region 11, a p-type high-concentration well region 13 and an n-type source region 14 are selectively formed. A source contact electrode 16 is ohmically connected on the high-concentration well region 13 and the source region 14. The source electrode 19 is connected to the source contact electrode 16 on the well region 11 through the source contact hole 18 provided in the interlayer insulating film 17. The source electrode 19 is connected to the source contact electrode 16 on the terminal well region 12 through a terminal well contact hole 18a provided in the interlayer insulating film 17 and the field insulating film 7.

The gate electrode 20 is disposed on the well region 11 with the gate insulating film 21 interposed therebetween. The gate electrode 20 has a portion disposed on the field insulating film 7. The portion is disposed on the halogen-containing terminal well portion 12h through the field insulating film 7 interposed therebetween, specifically the portion is disposed on the halogen-containing high-concentration terminal well portion 12ah via the field insulating film 7. The gate insulating film 21 has a thickness of 100 μm or less.

The interlayer insulating film 17 is disposed on the gate electrode 20. The gate wiring 22 is connected to a portion of the gate electrode 20 disposed on the field insulating film 7 through the gate contact hole 23. The field stop region 24 has n-type. The field stop region 24 is provided at a chip end portion of the MOSFET 201. The field stop region 24 is separated from the one of the FLR regions 5 which is at the outermost circumference, and the field stop region 24 encloses it. In Embodiment 7, the protective insulating film 10 covers the source electrode 19, the interlayer insulating film 17 on the field insulating film 7, the gate wiring 22, and the drift layer 2. The drain electrode 54 is in contact with the rear surface ohmic electrode 3.

Next, the method of manufacturing the MOSFET 201 is described below.

Figure 25:
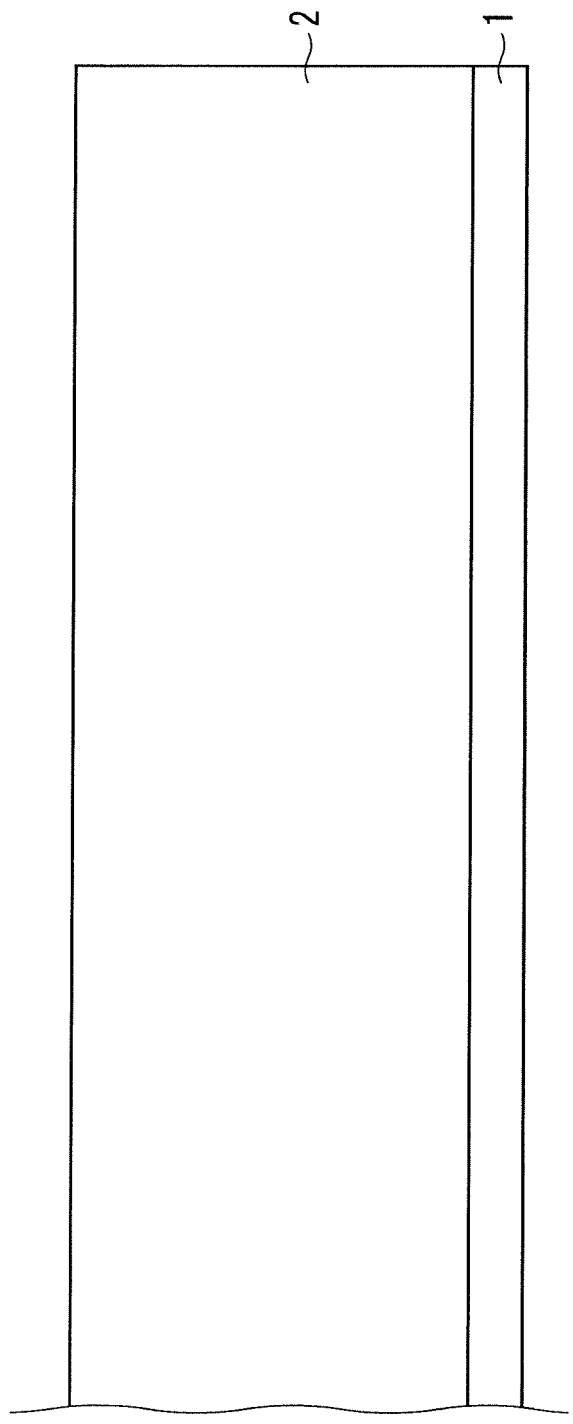
FIG. 25 A local sectional view schematically illustrating a step of a method of manufacturing the MOSFET of FIG. 24.
Figure 26:
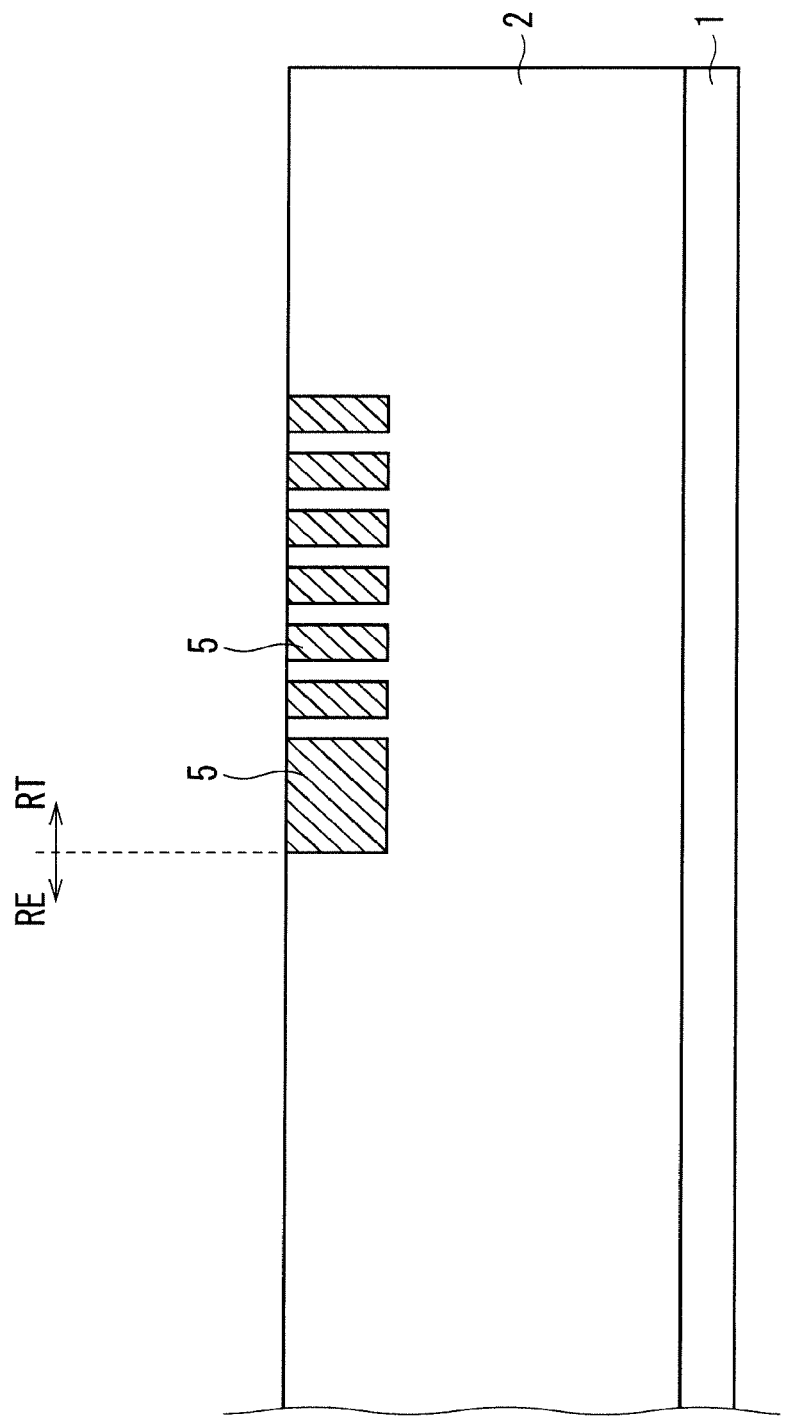
FIG. 26 A local sectional view schematically illustrating a step of the method of manufacturing the MOSFET of FIG. 24.

Referring to FIG. 25, similarly to Embodiment 1 described above, the drift layer 2 is formed on semiconductor substrate 1. Next, alignment marks (not shown) are formed on the surface of the drift layer 2 by photomechanical process and dry etching. Next, referring to FIG. 26, a resist mask (not shown) is formed on the surface of the drift layer 2 by photomechanical process. Next, local ion implantation using the resist mask as an implantation mask is performed in the same manner as in Embodiment 1. Accordingly, the FLR regions 5 are formed.

Figure 27:
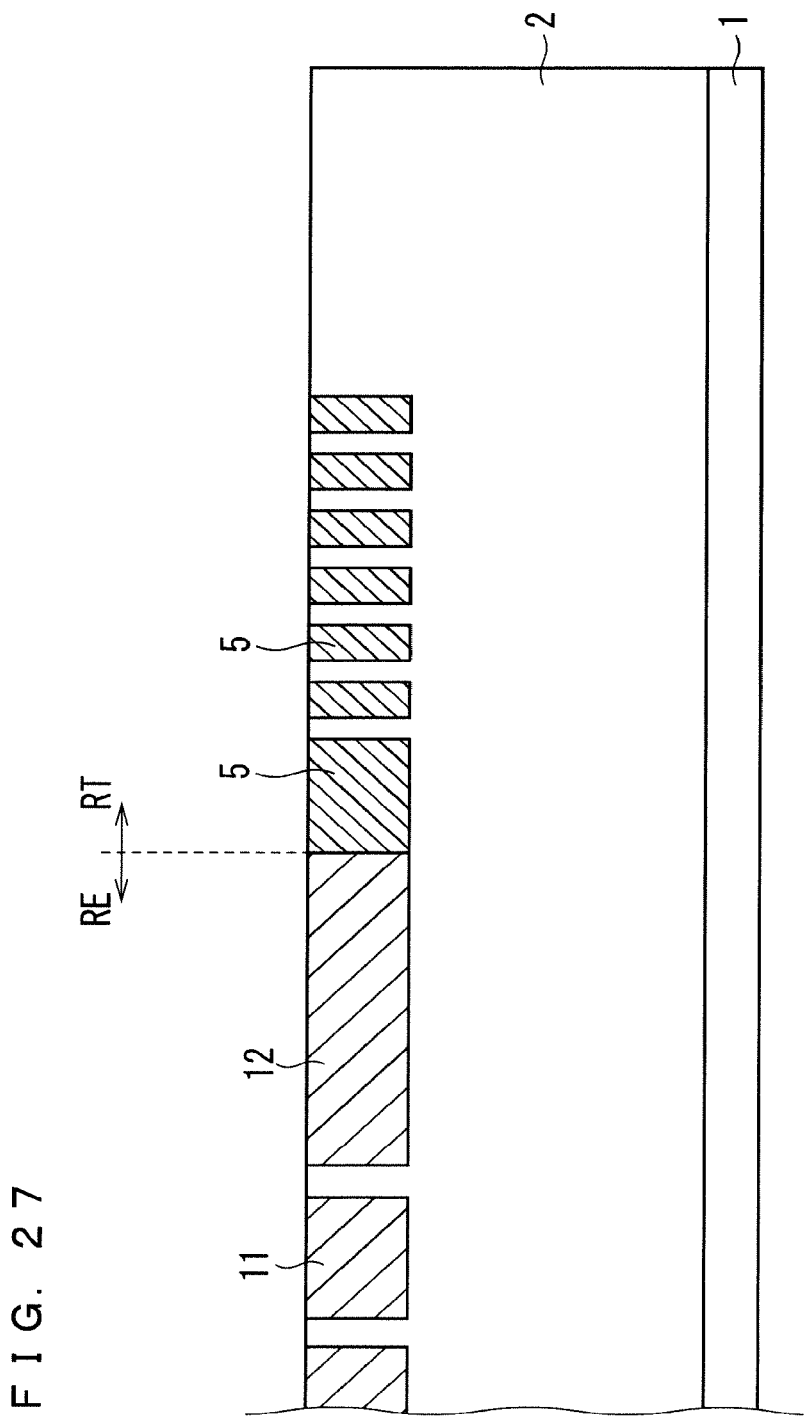
FIG. 27 A local sectional view schematically illustrating a step of the method of manufacturing the MOSFET of FIG. 24.

Referring to FIG. 27, an implantation mask (not shown) is reworked and local ion implantation using the mask is performed. Accordingly, the well region 11 and the terminal well region 12 are formed. Both regions may simultaneously be formed.

Figure 28:
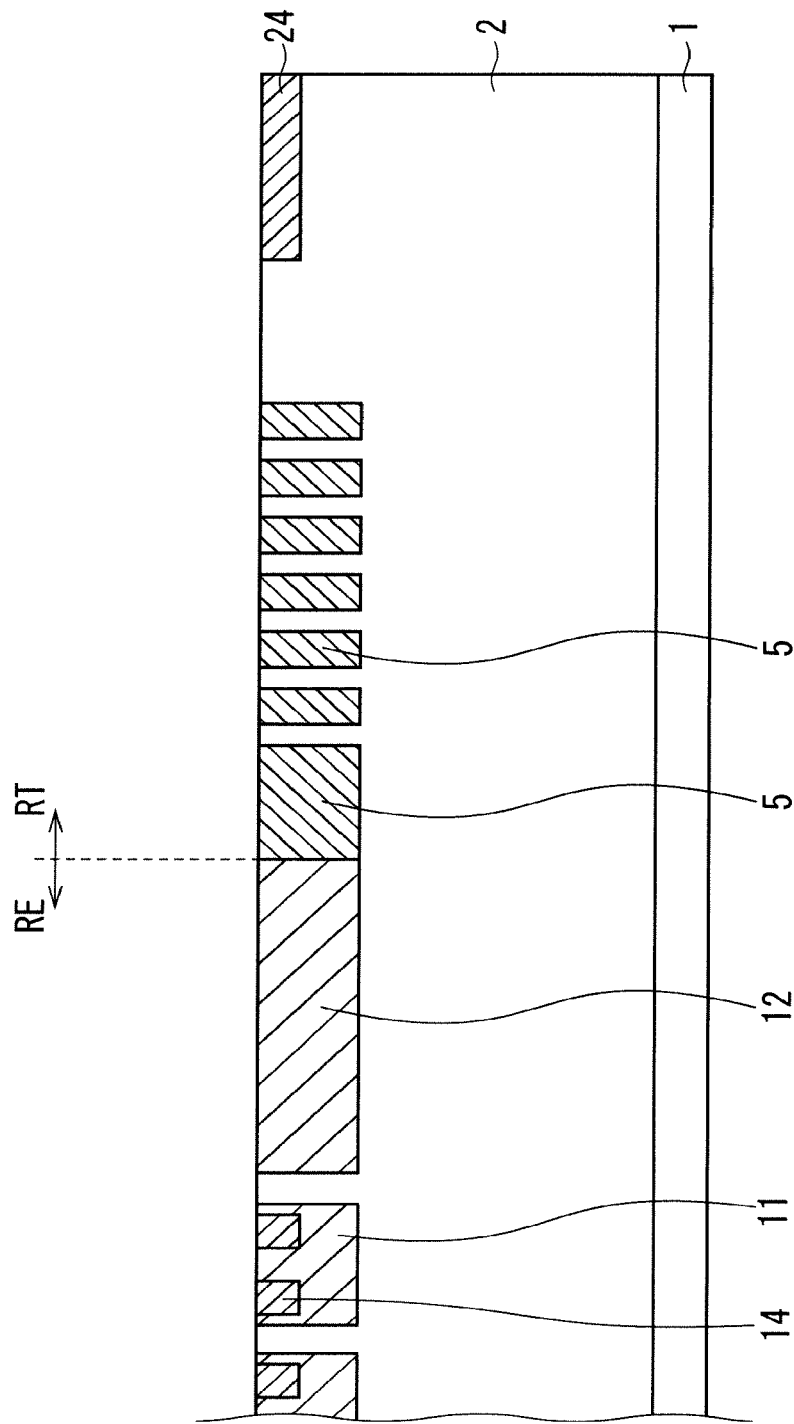
FIG. 28 A local sectional view schematically illustrating a step of the method of manufacturing the MOSFET of FIG. 24.

Referring to FIG. 28, an implantation mask (not shown) is reworked and local ion implantation using the mask is performed. Accordingly, the source region 14 and the field stop region 24 are formed. Both regions may simultaneously be formed. The ions to be implanted are donor ions, for example nitrogen or phosphorus. The concentration of ions to be implanted is in the range of $1\times10^{18}$ cm$^{-3}$ to $1\times10^{21}$ cm$^{-3}$ and exceeds the impurity concentration of the well region 11, which has the opposite conductivity type. The depth of the ion implantation is smaller than the depth of the well region 11.

Figure 29:
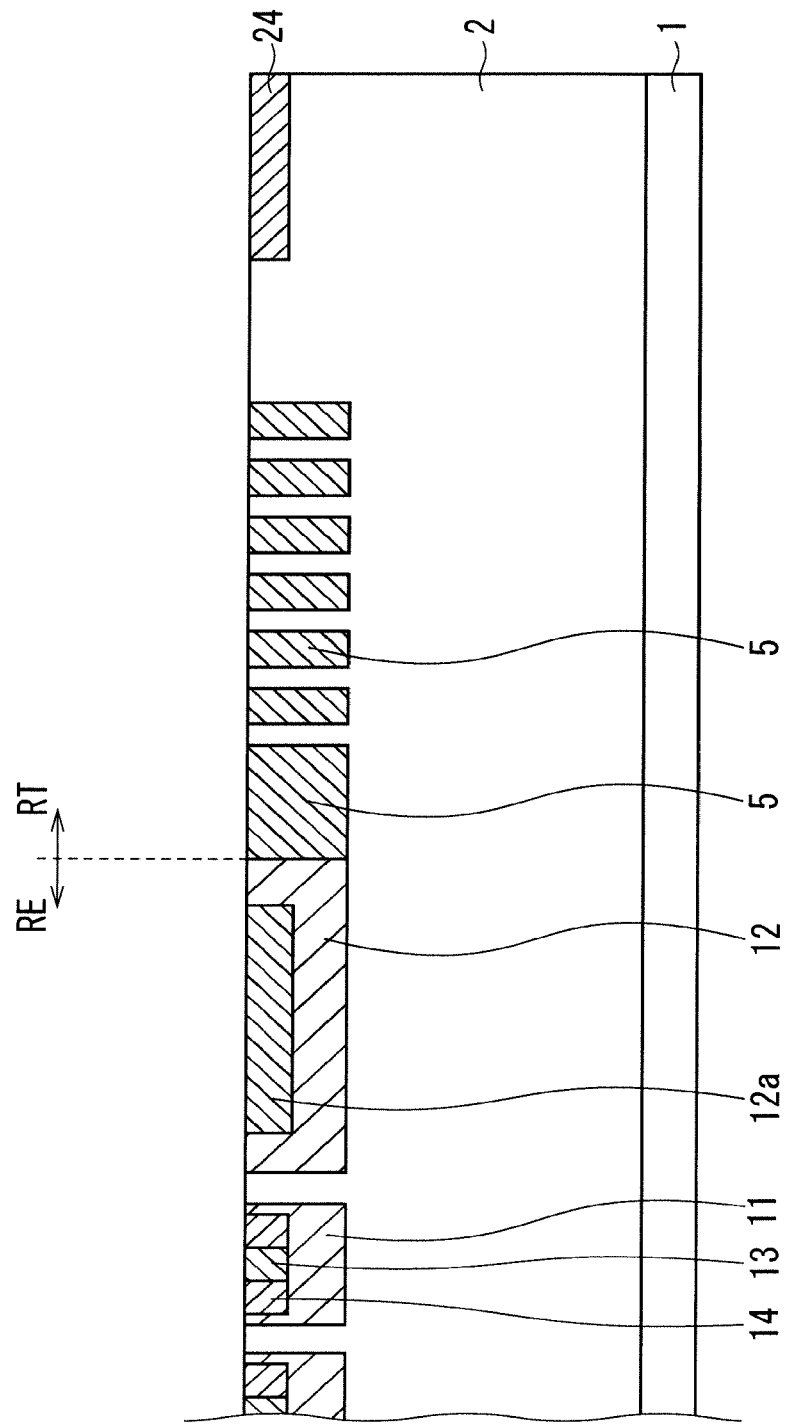
FIG. 29 A local sectional view schematically illustrating a step of the method of manufacturing the MOSFET of FIG. 24.

Referring to FIG. 29, an implantation mask (not shown) is reworked and local ion implantation using the mask is performed. Accordingly, the high-concentration well region 13 and high-concentration terminal well region 12a are formed. Both regions may simultaneously be formed. As the implantation mask, although a resist mask by photomechanical process may be used, a hard mask is preferably used. The hard mask is, for example, a silicon dioxide film formed by a CVD method and dry etching. The ion implantation temperature is preferably 150° C. or higher, whereby the high-concentration well region 13 and high-concentration terminal well region 12a with low sheet resistance are obtained. The depth of the ion implantation does not exceed the thickness of the well region 11 or the terminal well region 12.

Next, high-temperature annealing (activation annealing) to electrically activate the implanted conductive impurities is performed in the same manner as in Embodiment 1. The order of the above-described plurality of ion implantation steps is arbitrary.

Figure 30:
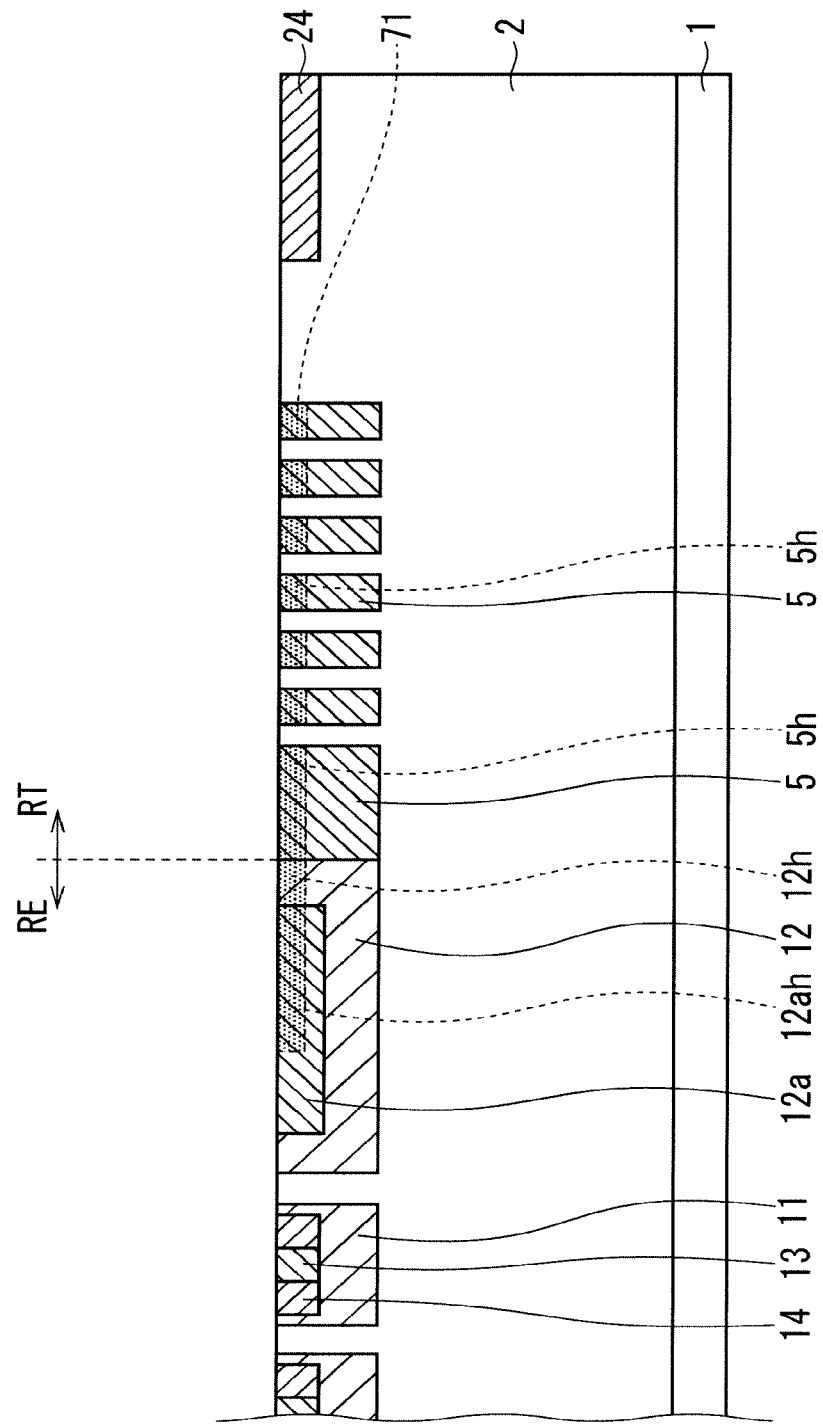
FIG. 30 A local sectional view schematically illustrating a step of the method of manufacturing the MOSFET of FIG. 24.

Referring to FIG. 30, halogen family atoms are implanted into the surface portions of the FLR regions 5 and the surface portion of the terminal well region 12 adjacent to the FLR region 5. Thus, the halogen-containing field limiting ring parts 5h and the halogen-containing terminal well part 12h are formed. Implantation is performed by ion implantation. The ion implantation amount is determined so that the negative fixed charge density due to the implanted halogen family atoms is $1\times10^{12}$ cm$^{-2}$ or more and $5\times10^{12}$ cm$^{-2}$, preferably $2\times10^{12}$ cm$^{-2}$, or so. The implantation depth of the halogen family atoms does not exceed the thickness of the FLR region 5 or the terminal well region 12 and is set to 0.2 μm or more and 1 μm or less, or so. Depending on the amount of negative fixed charge introduced, the ion implantation temperature may be 150° C. or higher. The negative fixed charge layer 71 is formed by the above-described implantation of the halogen family atoms. The negative fixed charge layer 71 is disposed only under the field insulating film 7 to be formed by a process to be described later. Therefore, the fixed charge layer 71 is not formed on the inner circumferential side of the terminal well region 12. The region where the fixed charge layer 71 is not formed as described above includes the inner circumferential side of the high-concentration terminal well region 12a.

Figure 31:
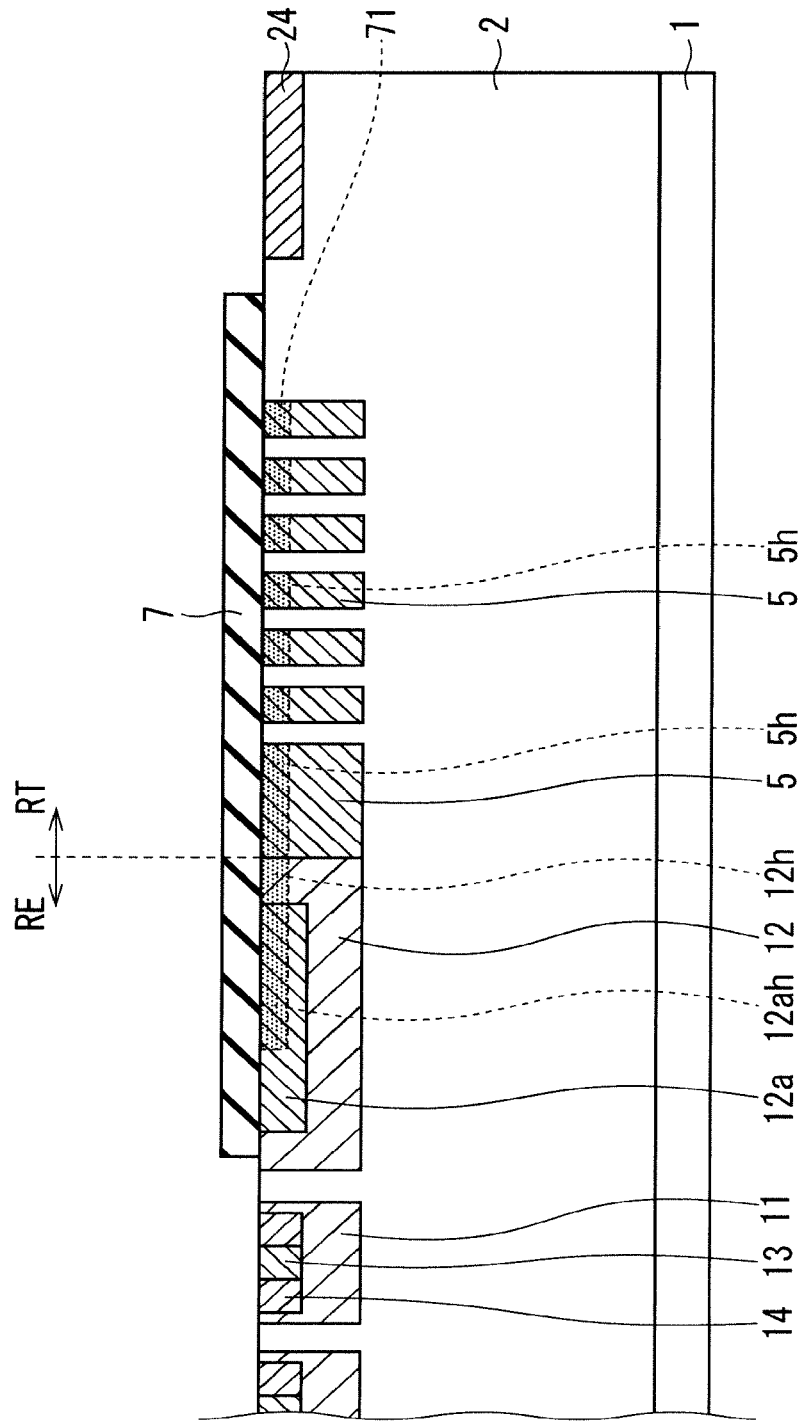
FIG. 31 A local sectional view schematically illustrating a step of the method of manufacturing the MOSFET of FIG. 24.

Referring to FIG. 31, the field insulating film 7 is formed. Specifically, a silicon dioxide film is deposited by a CVD method. And a pattern is imparted to the film by photomechanical process and etching.

Figure 32:
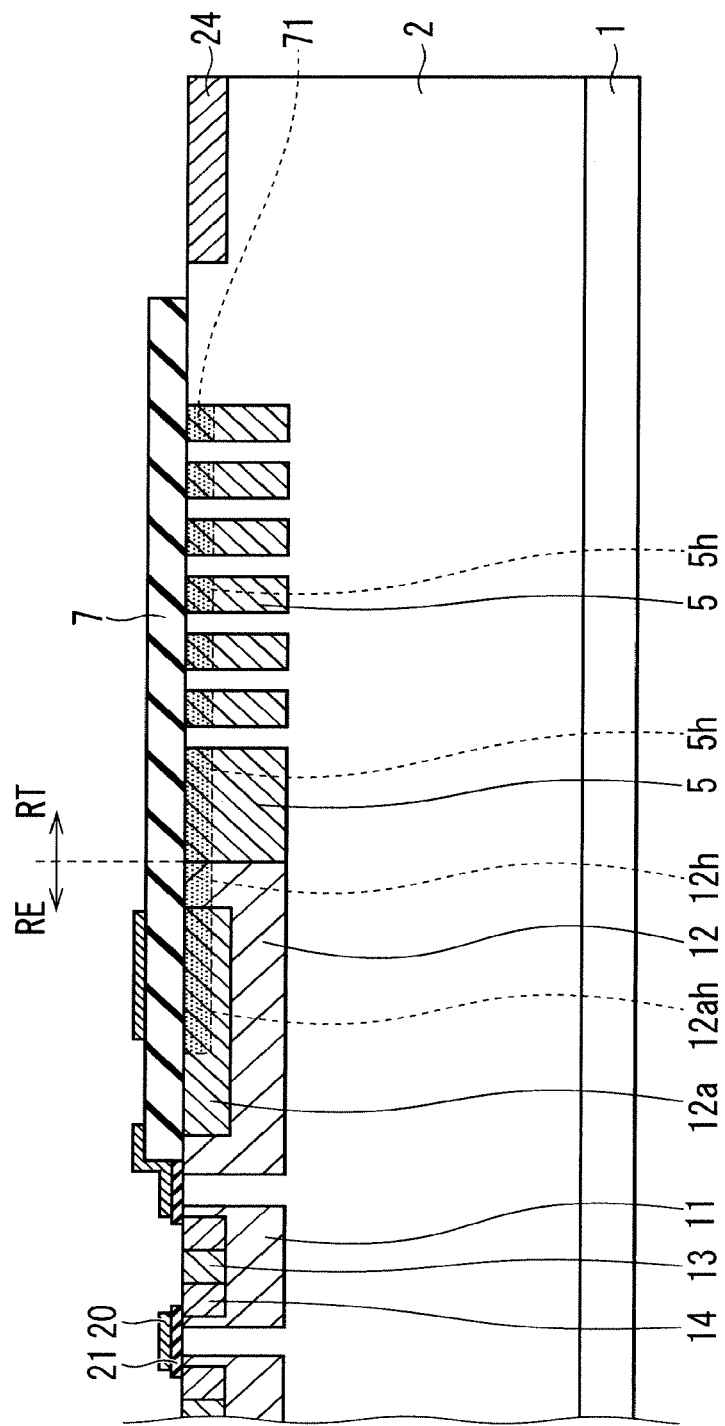
FIG. 32 A local sectional view schematically illustrating a step of the method of manufacturing the MOSFET of FIG. 24.

Referring to FIG. 32, the gate insulating film 21 made of silicon dioxide is formed by, for example, thermal oxidation or a CVD method. Next, the gate electrode 20 is formed. Specifically, a polycrystalline silicon film is deposited by a CVD method. And a pattern is imparted to the film by photomechanical process and etching.

Figure 33:
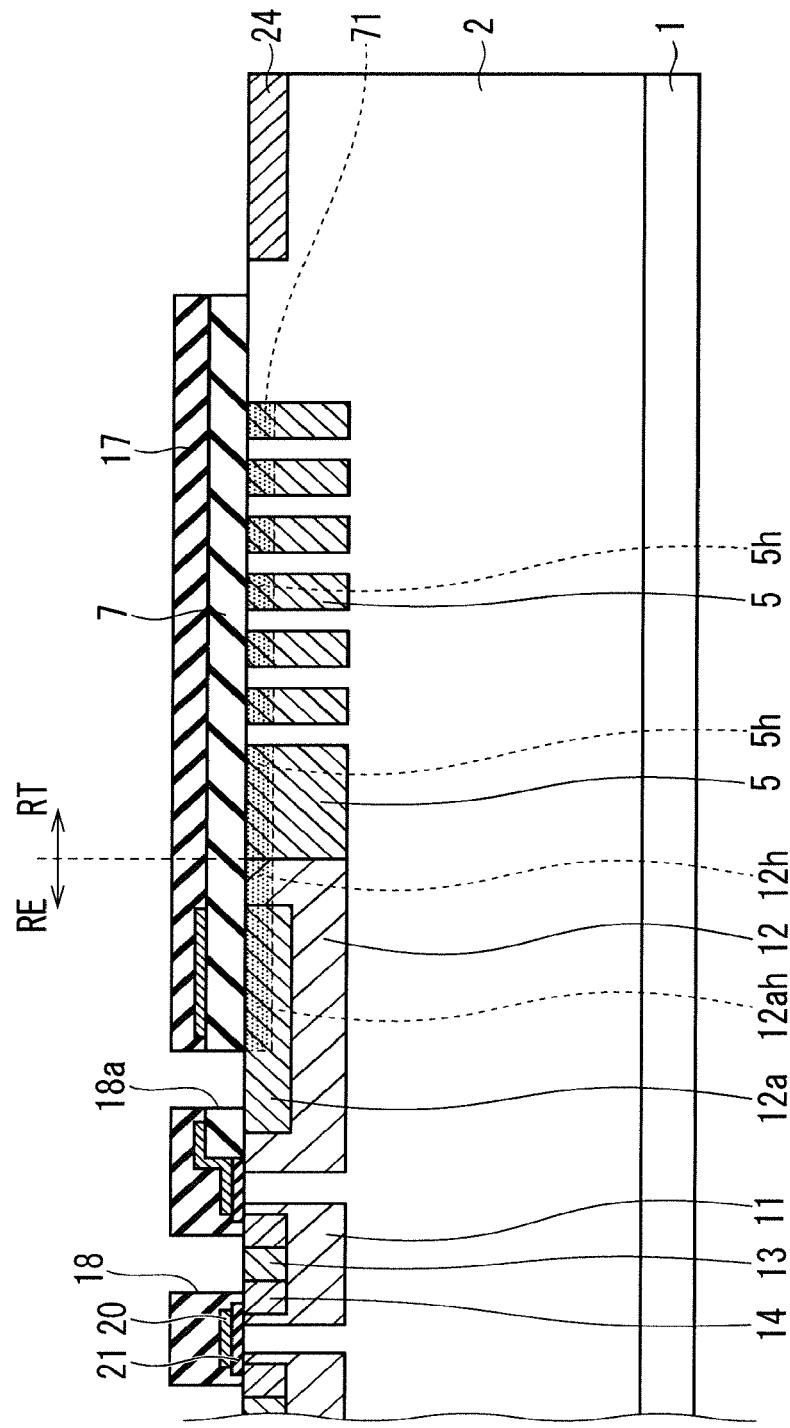
FIG. 33 A local sectional view schematically illustrating a step of the method of manufacturing the MOSFET of FIG. 24.

Referring to FIG. 33, an interlayer insulating film 17 is deposited on the semiconductor layer provided with the field insulating film 7, the gate insulating film 21, and the gate electrode 20, by a CVD method, for example. And a pattern is imparted to the film by photomechanical process and etching. Thereby, the source contact hole 18 is formed. In the patterning, a terminal well contact hole 18a which penetrates through the interlayer insulating film 17 and the field insulating film 7 and reaches the high-concentration terminal well region 12a is also formed.

Figure 34:
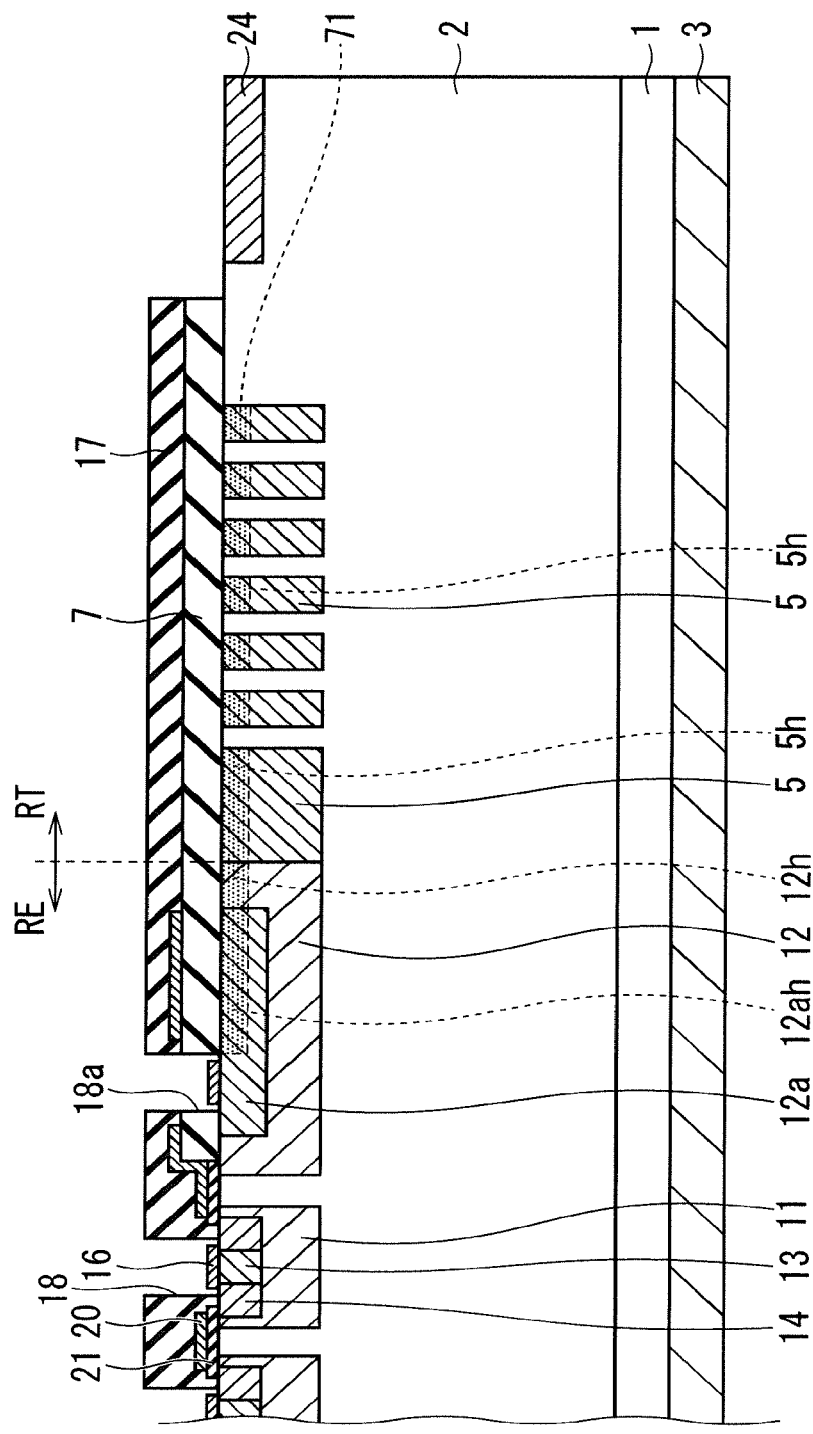
FIG. 34 A local sectional view schematically illustrating a step of the method of manufacturing the MOSFET of FIG. 24.

Referring to FIG. 34, the source contact electrode 16 is formed at the bottom of the source contact hole 18 and the terminal well contact hole 18a. Specifically, first, a metal film such as Ni is formed. Thereafter, by heat treatment at 600° C. to 1100° C., a nickel silicide film is formed. Thereafter, the unreacted metal film on the interlayer insulating film 17 is removed by etching. Thereby, the source contact electrode 16 is obtained. By the same method, the rear surface ohmic electrode 3 is formed on the rear surface of the semiconductor substrate 1.

Figure 35:
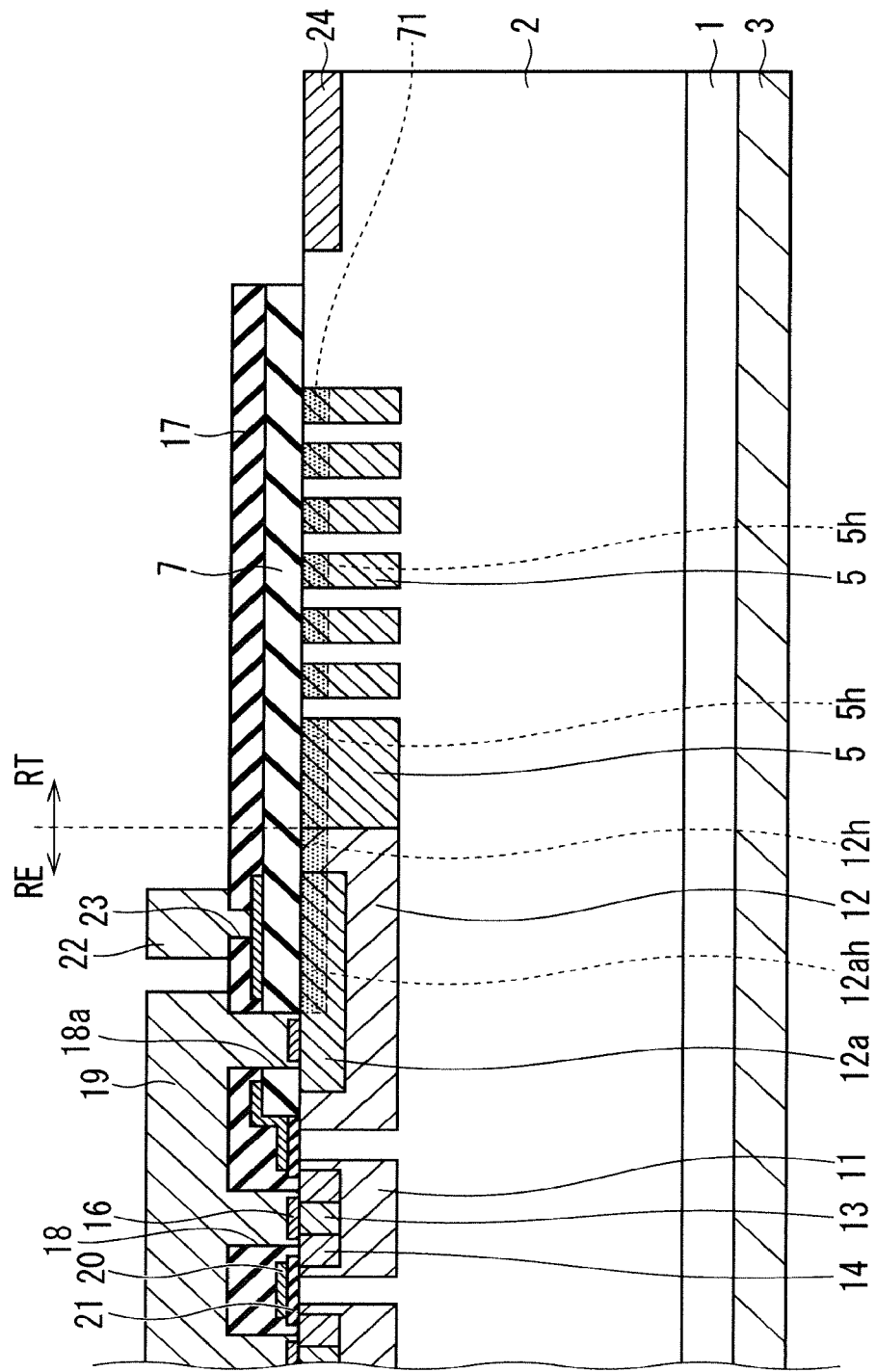
FIG. 35 A local sectional view schematically illustrating a step of the method of manufacturing the MOSFET of FIG. 24.

Referring to FIG. 35, the source electrode 19 and the gate wiring 22 are formed on the interlayer insulating film 17. Specifically, first, the gate contact hole 23 is formed by photomechanical process and etching. Thereafter, a metal film made of, for example, aluminum is formed by a sputtering method or a evaporation method. Photomechanical process and etching are performed again, thereby imparting a pattern to the metal film. Thereby, the source electrode 19 and the gate wiring 22 are obtained.

Figure 36:
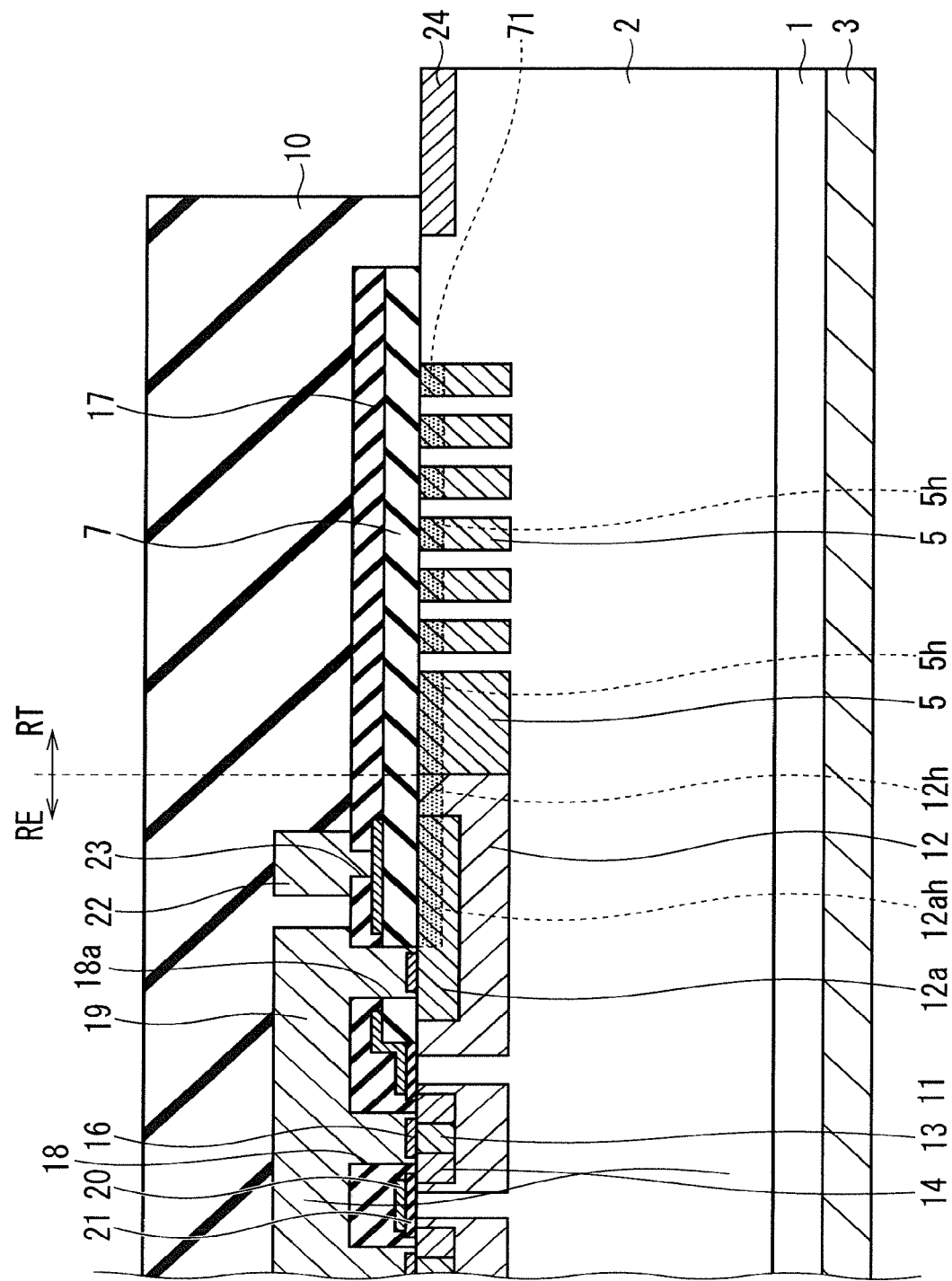
FIG. 36 A local sectional view schematically illustrating a step of the method of manufacturing the MOSFET of FIG. 24.

Referring to FIG. 36, the protective insulating film 10 is formed by film formation and patterning using photomechanical process and etching.

Referring again to FIG. 24, a metal film of titanium, nickel, silver, gold, or aluminum, for example, is formed on the rear surface ohmic electrode 3 by a sputtering method or a vapor deposition method. Accordingly, the drain electrode 54 is formed. As a result, the MOSFET 201 is completed.

According to Embodiment 7, substantially the same effects as Embodiment 1 are also obtained in the MOSFET. Further, according to the above-described method of manufacturing, the crystalline damage attributed to the halogen family atom implantation step (FIG. 30) is recovered by a step accompanying heating, which is performed thereafter. The step that involves heating to an extent that is effective for recovering crystallinity may be a thermal oxidation step for forming the gate insulating film 21, or a silicidation step for forming the source contact electrode 16 and the rear surface ohmic electrode 3.

Embodiment 8

Figure 37:
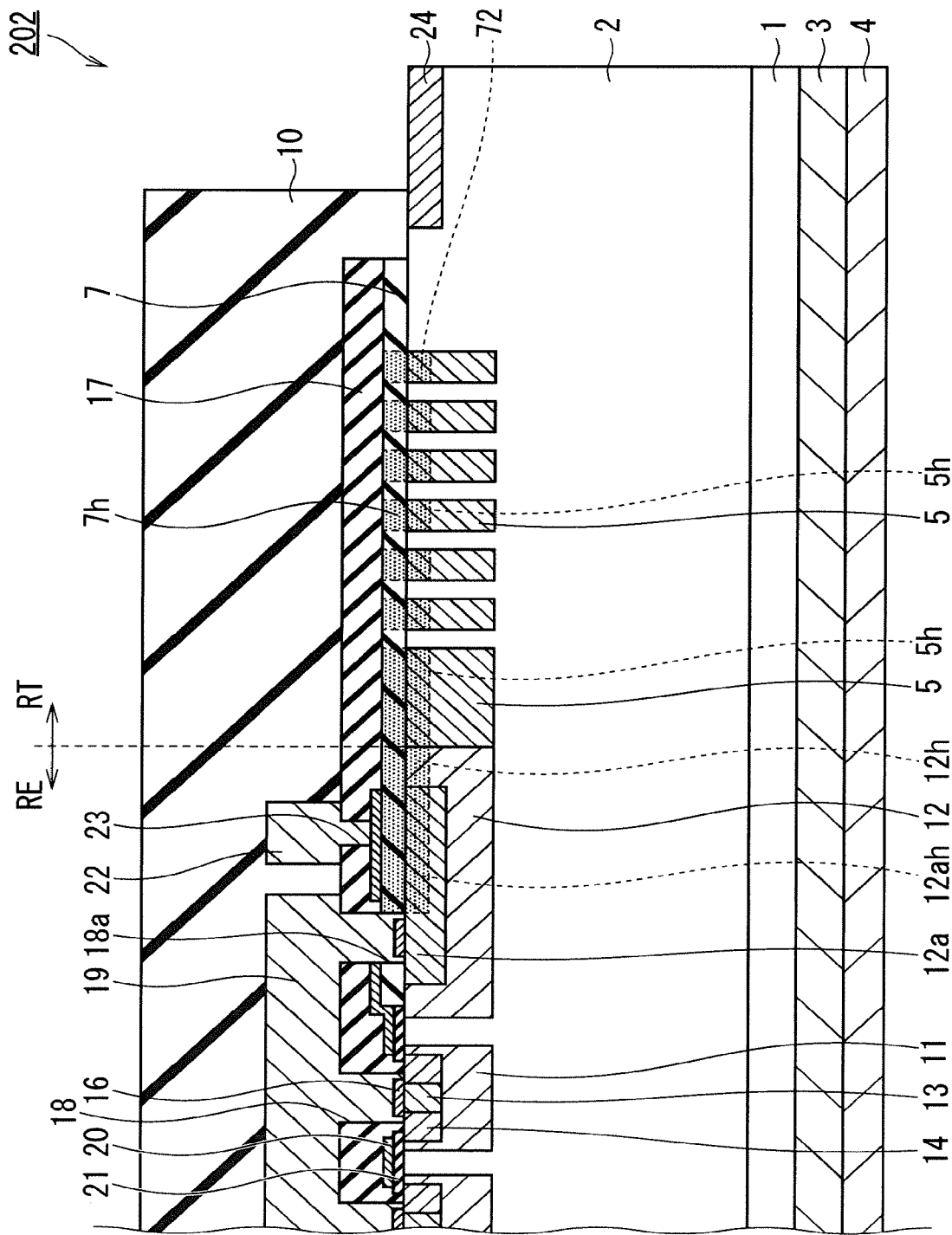
FIG. 37 A local sectional view schematically illustrating a configuration of a MOSFET as a silicon carbide semiconductor device according to Embodiment 8 of the present invention.

FIG. 37 is a local sectional view schematically illustrating a configuration of a MOSFET (silicon carbide semiconductor device) 202 according to Embodiment 8. In the MOSFET 202, unlike the MOSFET 201 (FIG. 24: Embodiment 7), the field insulating film 7 has halogen-containing field insulating parts 7h. The halogen-containing field insulating part 7h contains halogen family atoms and is located on the halogen-containing field limiting ring part 5h and the halogen-containing terminal well part 12h. Therefore, in the MOSFET 202, a negative fixed charge layer 72 caused by halogen family atoms includes portions formed of the halogen-containing field limiting ring parts 5h and portions formed of the halogen-containing field insulating parts 7h on the halogen-containing field limiting ring parts 5h.

Figure 38:
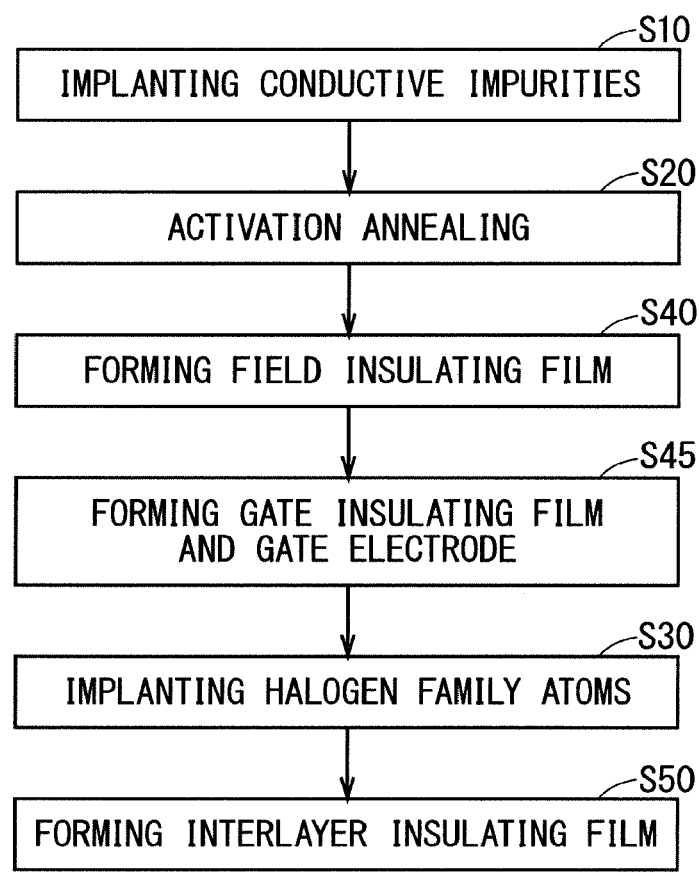
FIG. 38 A flow chart illustrating the method of manufacturing the MOSFET of FIG. 37.

Referring further to FIG. 38, in the fabrication of MOSFET 202, the implantation of halogen family atoms (step S30) is performed after forming the field insulating film 7 (step S40), forming the gate insulating film 21 and the gate electrode 20 (step S45), and before forming the interlayer insulating film 17 (step S50). In the Embodiment 7 described above, the implantation of halogen family atoms (step S30) is performed before forming the field insulating film 7 (step S40). In the step of implanting halogen family atoms performed after the formation of the field insulating film 7, a portion of the halogen family atoms to be implanted are required to penetrate through the field insulating film 7. Therefore, in Embodiment 8, the field insulating film 7 needs to be thin enough to allow sufficient penetration of halogen family atoms, and preferably has a thickness of, for example, 100 nm or more and 500 nm or less, or so.

According to Embodiment 8, unlike in Embodiment 7, the step of forming the gate insulating film 21 and the gate electrode 20 is not performed after the implantation of the halogen family atoms Accordingly, desorption of halogen family atoms attributed to the step is avoided. In particular, in the case where a thermal oxidation process accompanied by an extended high-temperature treatment is employed for forming the gate insulating film 21, if halogen family atoms are implanted before the treatment, desorption of halogen family atoms is likely to occur.

In Embodiment 8, the thermal oxidation step for forming the gate insulating film 21 does not contribute to the recovery of crystalline damage attributed to the halogen family atom implantation step. However, in the heating in the silicidation step for forming the source contact electrode 16 and the rear surface ohmic electrode 3, the crystalline damage is recovered to some extent.

Embodiment 9

Figure 39:
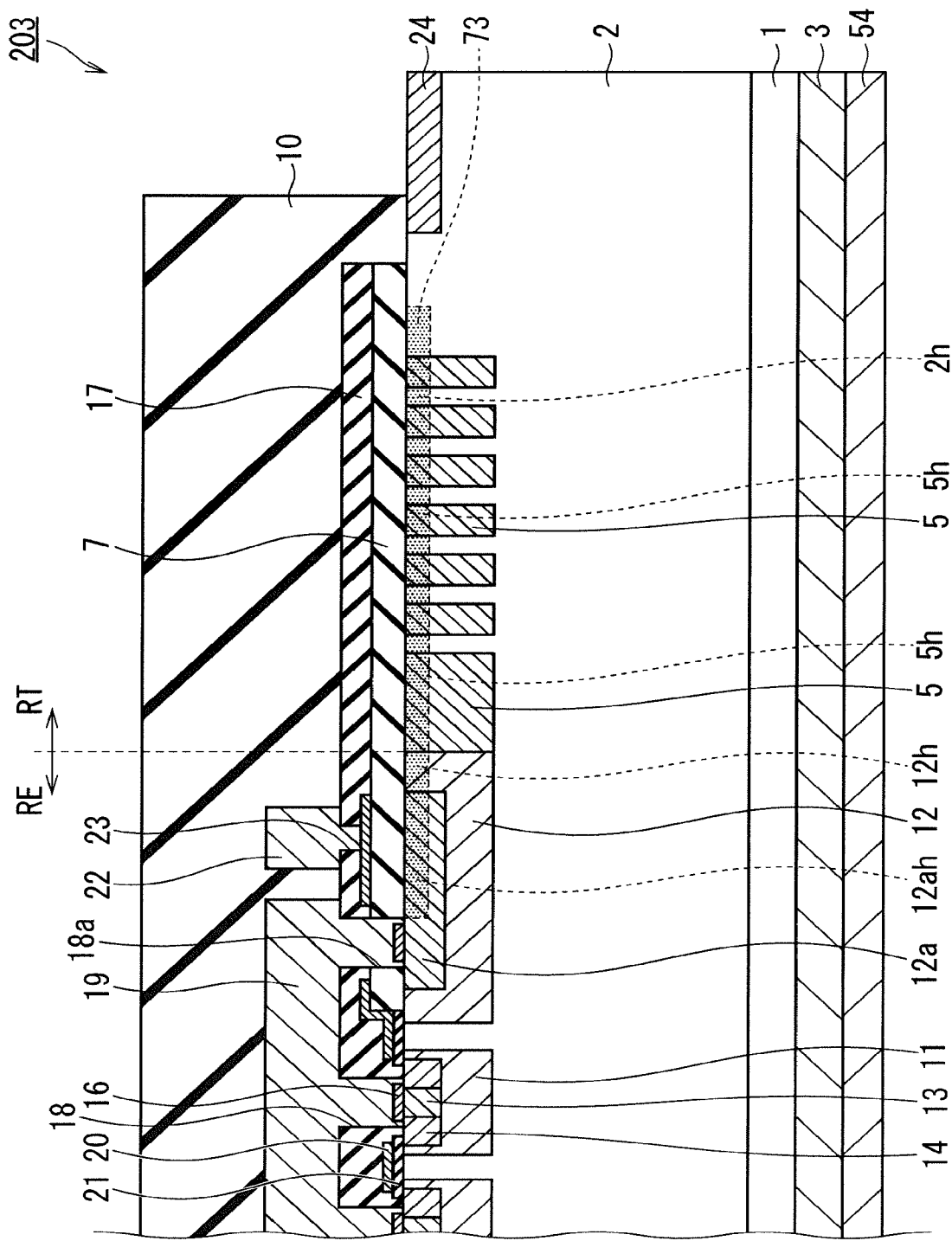
FIG. 39 A local sectional view schematically illustrating a configuration of a MOSFET as a silicon carbide semiconductor device according to Embodiment 9 of the present invention.

FIG. 39 is a local sectional view schematically illustrating a configuration of a MOSFET (silicon carbide semiconductor device) 203 according to Embodiment 9. In the MOSFET 203, similarly to the SBD 104 (FIG. 20: Embodiment 5), the drift layer 2 has halogen-containing semiconductor parts 2h. Therefore, in the MOSFET 203, a negative fixed charge layer 73 caused by halogen family atoms includes portions formed of the halogen-containing semiconductor parts 2h adjacent to the portions formed of the halogen-containing field limiting ring parts 5h. The configuration enables to obtain substantially the same effects as Embodiment 5 in the MOSFET.

Figure 40:
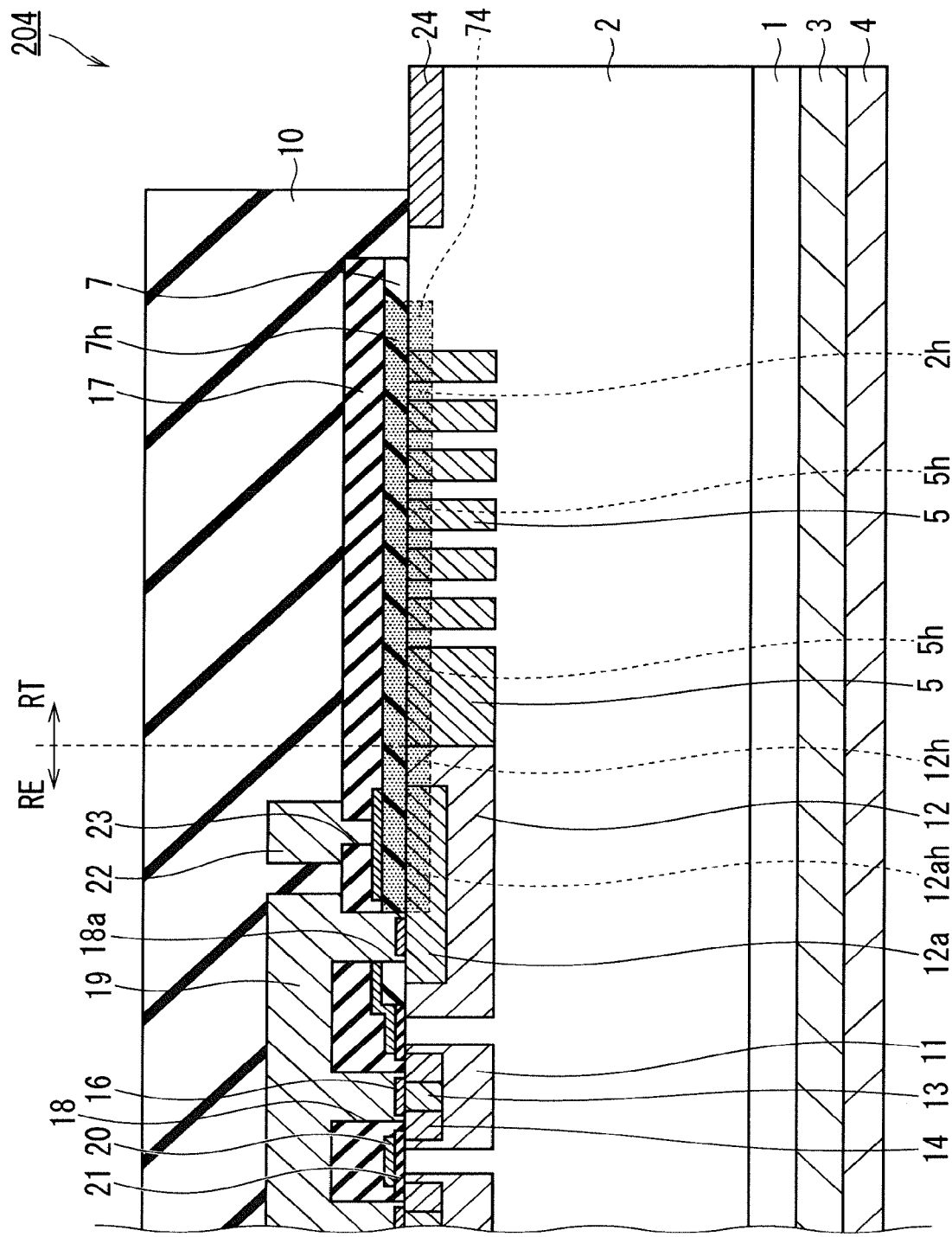
FIG. 40 A local sectional view schematically illustrating a configuration of a MOSFET as a silicon carbide semiconductor device in Modification according to Embodiment 9 of the present invention.

Referring to FIG. 40, the field insulating film 7 of the MOSFET (silicon carbide semiconductor device) 204 of Modification has a halogen-containing field insulating part 7h on the halogen-containing field limiting ring parts 5h and the halogen-containing semiconductor parts 2h. Therefore, in the MOSFET 204, the negative fixed charge layer 74 caused by halogen family atoms includes a portion formed of the halogen-containing field insulating part 7h. The MOSFET 204 is manufactured by substantially the same method as the manufacturing method described in Embodiment 8. Accordingly, desorption of the implanted halogen family atoms is suppressed.

Embodiment 10

Figure 41:
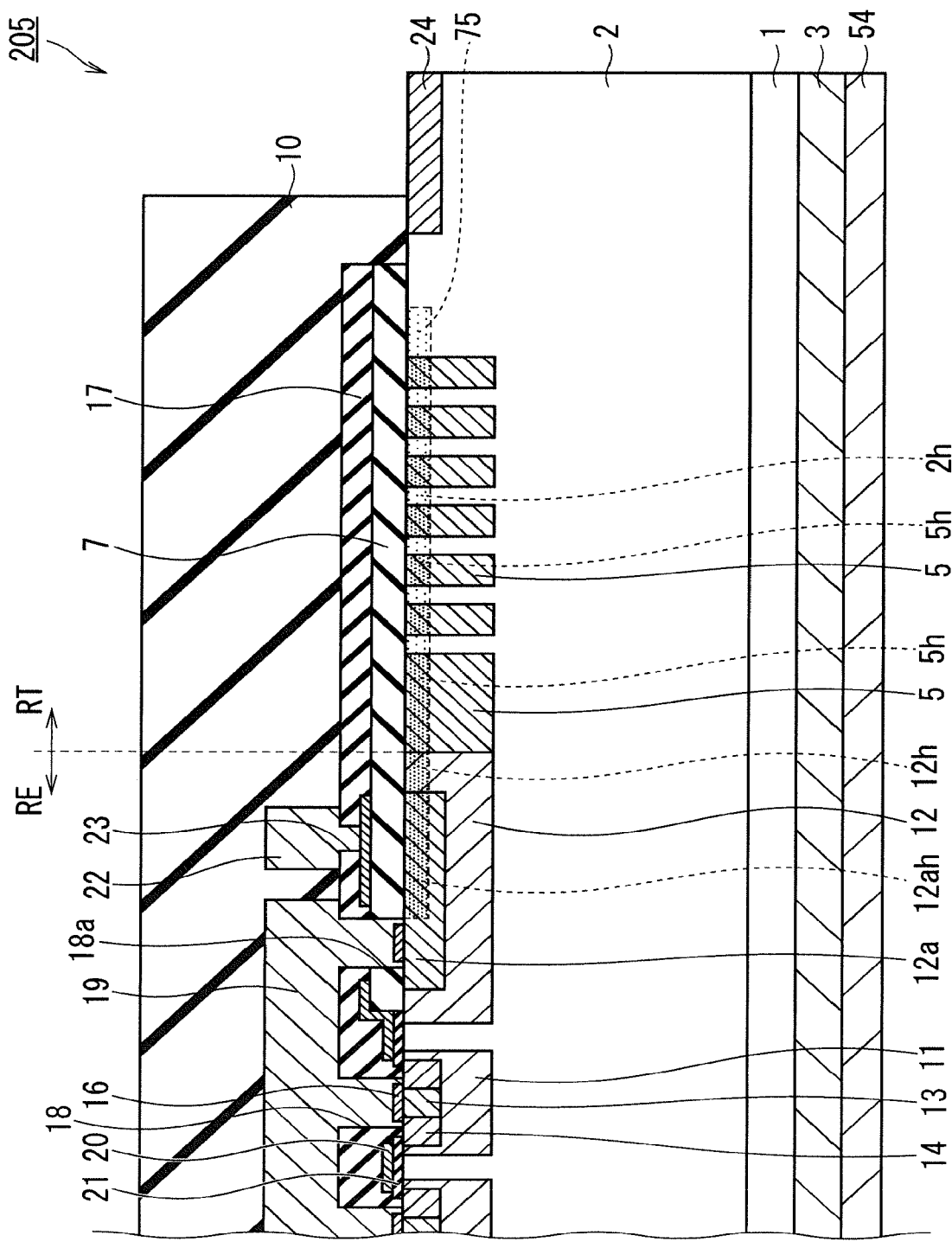
FIG. 41 A local sectional view schematically illustrating a configuration of a MOSFET as a silicon carbide semiconductor device according to Embodiment 10 of the present invention.

FIG. 41 is a local sectional view schematically illustrating a configuration of a MOSFET (silicon carbide semiconductor device) 205 according to Embodiment 10. In the MOSFET 204, similarly to SBD 106 (FIG. 22: Embodiment 6), each halogen-containing semiconductor part 2h has a larger negative fixed charge density than the negative fixed charge density of each halogen-containing field limiting ring part 5h. Therefore, in the MOSFET 205, a negative fixed charge layer 75 caused by halogen family atoms includes portions formed of the halogen-containing field limiting ring parts 5h and portions formed of the halogen-containing semiconductor parts 2h adjacent to the halogen-containing field limiting ring parts 5h, and the latter portions have a larger negative fixed charge density. The configuration enables to obtain substantially the same effects as Embodiment 6 in the MOSFET.

Figure 42:
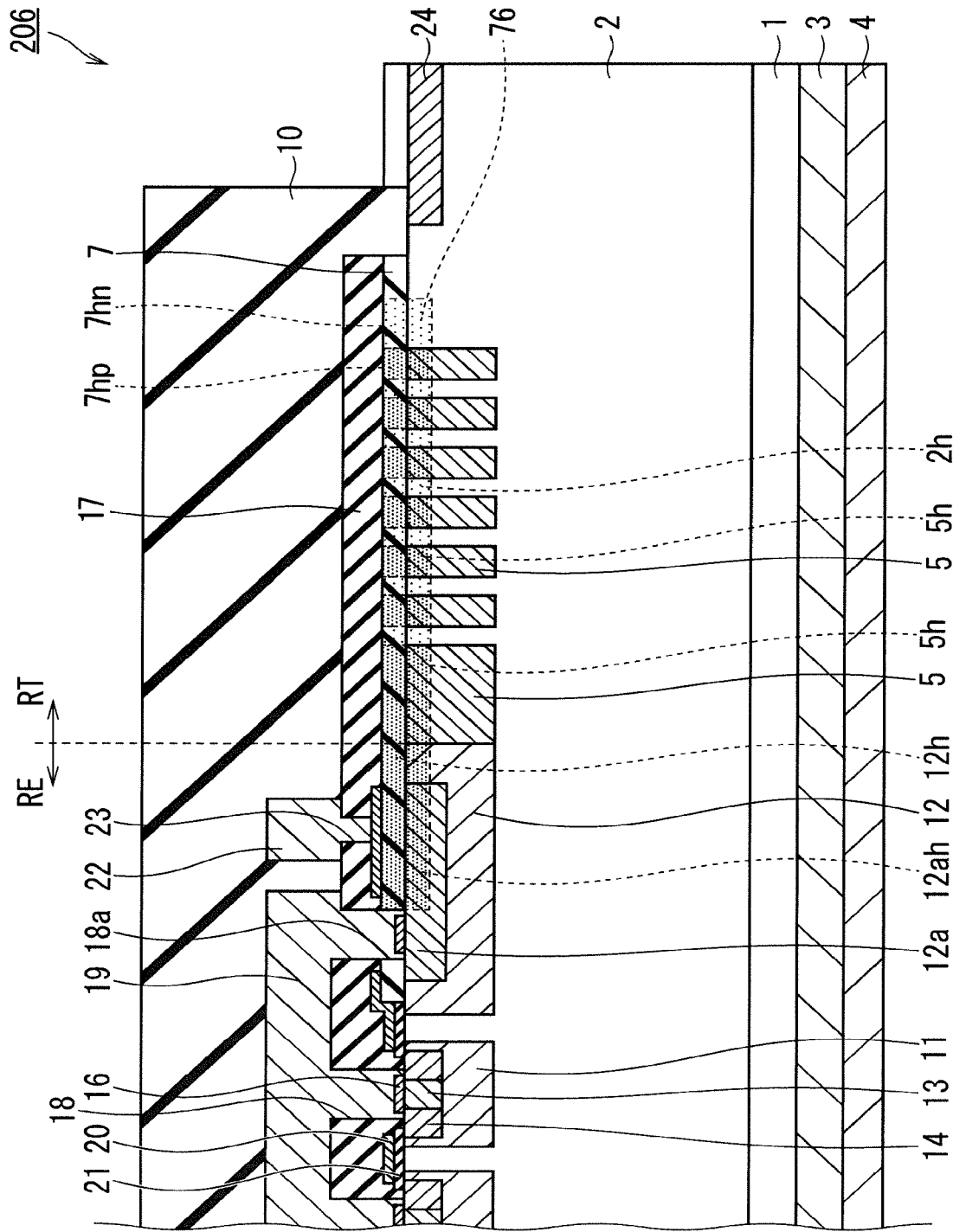
FIG. 42 A local sectional view schematically illustrating a configuration of a MOSFET as a silicon carbide semiconductor device in Modification according to Embodiment 10 of the present invention.

Referring to FIG. 42, the field insulating film 7 of the MOSFET (silicon carbide semiconductor device) 206 of Modification has halogen-containing field insulating parts 7hp on the halogen-containing field limiting ring parts 5h and the halogen-containing well region part 12h. Also the field insulating film 7 has halogen-containing field insulating parts 7hn on the halogen-containing semiconductor parts 2h. Therefore, in the MOSFET 206, the negative fixed charge layer 76 caused by halogen family atoms includes the halogen-containing field insulating parts 7hp and the halogen-containing field insulating parts 7hn. The negative fixed charge density of each halogen-containing field insulating part 7hn is larger than the negative fixed charge density of each halogen-containing field insulating part 7ahp. The MOSFET 204 is manufactured by substantially the same method as the manufacturing method described in Embodiment 8. Accordingly, desorption of the implanted halogen family atoms is suppressed.

In Embodiments 1 to 6 described above, the SBDs 101 to 107 have been described; however, as a modification, a diode element other than the SBD may be configured. Specifically, a junction barrier Schottky (JBS) diode may be formed by providing a p-type semiconductor layer region in a part of the drift layer 2 under a Schottky electrode 8 which is an active region. Alternatively, a mixed pin Schottky (MPS) diode may be configured with the Schottky electrode 8 having both a Schottky junction and an ohmic junction to the drift layer 2. Alternatively, a pin (PiN) diode may be configured by providing a p-type semiconductor region in the drift layer 2 under the Schottky electrode 8 which is the active region, and providing an ohmic contact electrode instead of the Schottky electrode 8.

In Embodiments 7 to 10 described above, the planar type MOSFETs 201 to 205 have been described; however, as a modification, a trench type MOSFET may be configured. Alternatively, a metal insulator semiconductor field effect transistor (MISFET) other than the MOSFET may be configured. Alternatively, a junction FET (JFET) or a metal semiconductor field effect transistor (MESFET) may be configured instead of the MISFET. Alternatively, the IGBT may be configured instead of the FET.

In each of above Embodiments, a semiconductor device using SiC as a semiconductor material has been described. However, other semiconductor materials than SiC may be applied as long as a fixed charge is present at the interface of the semiconductor/insulating film. For example, a compound semiconductor material such as GaN may be applied.

It should be noted that Embodiments and Modification of the present invention can be arbitrarily combined and can be appropriately modified or omitted without departing from the scope of the invention. While the invention has been described in detail, the foregoing description is in all aspects illustrative and not restrictive. It is understood that numerous other modifications and variations can be devised without departing from the scope of the invention.

EXPLANATION OF REFERENCE SIGNS

RE element region, RT terminal region, 101 to 107 SBD (silicon carbide semiconductor device), 201 to 206 MOSFET (silicon carbide semiconductor device), 1 semiconductor substrate, 2 drift layer (semiconductor layer), 2h halogen-containing semiconductor part, 3 rear surface ohmic electrode, 4 cathode electrode, 5 field limiting ring region (FLR region), 5 high-concentration region, 5h halogen-containing field limiting ring part, 5ha halogen-containing high-concentration part, 7 field insulating film, 7a thermal oxide film, 7b CVD film (deposition film), 7h, 7ah, 7hp, 7ahn 7ahp halogen-containing field insulating part, 8 Schottky electrode, 9 anode electrode, 10 protective insulating film, 11 well region, 12 terminal well region, 12a high-concentration terminal well region, 12h halogen-containing terminal well part, 12ah halogen-containing high-concentration terminal well part, 13 high-concentration well region, 14 source region, 16 source contact electrode, 17 interlayer insulating film, 18 source contact hole, 18a terminal well contact hole, 19 source electrode, 20 gate electrode, 21 gate insulating film, 22 gate wiring, 23 gate contact hole, 24 field stop region, 54 drain electrode, 61 to 66, 71 to 76 fixed charge layer

The invention claimed is:

1. A silicon carbide semiconductor device, comprising:
   a semiconductor substrate;
   a semiconductor layer having n-type, provided on the semiconductor substrate, made of silicon carbide, and having an element region and a terminal region outside the element region;
   a plurality of field limiting ring regions having p-type, provided in the terminal region of the semiconductor layer, and arranged spaced apart from one another; and
   a field insulating film provided on the terminal region of the semiconductor layer, and in contact with the field limiting ring regions and the semiconductor layer, each of the field limiting regions comprising a halogen-containing field limiting ring part, the halogen-containing field limiting ring part being in contact with the field insulating film and comprising halogen family atoms.

2. The silicon carbide semiconductor device according to claim 1, wherein the field insulating film comprises a halogen-containing field insulating part being located on the halogen-containing field limiting ring part and comprising halogen family atoms.

3. The silicon carbide semiconductor device according to claim 1, wherein the semiconductor layer comprises a halogen-containing semiconductor part being in contact with the field insulating film between the field limiting ring regions and comprising halogen family atoms.

4. The silicon carbide semiconductor device according to claim 3, wherein the halogen-containing semiconductor part has a larger negative fixed charge density than a negative fixed charge density of the halogen-containing field limiting ring part.

5. A method of manufacturing the silicon carbide semiconductor device of claim 1, the method comprising:
    forming the semiconductor layer on the semiconductor substrate;
    forming the plurality of field limiting ring regions in the terminal region of the semiconductor layer by implanting acceptor ions;
    performing activation annealing to electrically activate the acceptor ions;
    forming the halogen-containing field limiting ring part by implanting the halogen family atoms into a part of each of the field limiting ring regions; and
    forming the field insulating film on the terminal region of the semiconductor layer.

6. The method according to claim 5, wherein the performing activation annealing to electrically activate the acceptor ions is performed before the forming the halogen-containing field limiting ring part.

7. The method according to claim 5, wherein the performing activation annealing to electrically activate the acceptor ions is performed after the forming the halogen-containing field limiting ring part.

8. The method according to claim 5, wherein the field insulating film comprises a thermal oxide film.

9. The method according to claim 5, wherein at least a part of the field insulating film is formed before the forming the halogen-containing field limiting ring part, and, in the forming the halogen-containing field limiting ring part, the halogen family atoms are implanted through the at least a part of the field insulating film.

* * * * *